US012772674B2

(12) United States Patent
Kim et al.

(10) Patent No.: US 12,772,674 B2
(45) Date of Patent: Oct. 20, 2026

(54) DISPLAY DEVICE

(71) Applicant: Samsung Display Co., Ltd., Yongin-si (KR)

(72) Inventors: Haemin Kim, Yongin-si (KR); Youngwan Seo, Yongin-si (KR); Geunho Lee, Yongin-si (KR); Kyunghoon Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 431 days.

(21) Appl. No.: 18/347,014

(22) Filed: Jul. 5, 2023

(65) Prior Publication Data

US 2024/0099080 A1 Mar. 21, 2024

(30) Foreign Application Priority Data

Sep. 21, 2022 (KR) ........................ 10-2022-0119315

(51) Int. Cl.

*H10K 59/124* (2023.01)
*H10K 59/121* (2023.01)
*H10K 59/131* (2023.01)

(52) U.S. Cl.

CPC ....... *H10K 59/124* (2023.02); *H10K 59/1213* (2023.02); *H10K 59/1216* (2023.02); *H10K 59/131* (2023.02)

(58) Field of Classification Search

CPC .... H10D 86/423; H10D 86/481; H10D 86/60; H10D 30/6734; H10D 30/6755; H10K 59/1213; H10K 59/1216; H10K 59/131; H10K 59/124

See application file for complete search history.

(56) References Cited

U.S. PATENT DOCUMENTS

| | | | | |
|---|---|---|---|---|
| 9,548,321 | B2 | 1/2017 | Lee et al. | |
| 2021/0151542 | A1* | 5/2021 | Choe .................... | G09G 3/3233 |
| 2021/0202540 | A1* | 7/2021 | Kuwahara ............ | H10D 86/423 |
| 2021/0320162 | A1 | 10/2021 | Jeon et al. | |

(Continued)

FOREIGN PATENT DOCUMENTS

| | | |
|---|---|---|
| CN | 113707725 | 11/2021 |
| KR | 10-2016-0057516 | 5/2016 |

(Continued)

OTHER PUBLICATIONS

Extended European Search Report for European Patent Application No. 23196397.6, dated Feb. 6, 2024.

*Primary Examiner* — Vongsavanh Sengdara
(74) *Attorney, Agent, or Firm* — F. CHAU & ASSOCIATES, LLC

(57) ABSTRACT

A display device includes a base layer, a first conductive layer disposed on the base layer, an inorganic layer disposed on the first conductive layer, a first semiconductor layer including an oxide semiconductor and disposed on the inorganic layer, and a first insulation layer disposed on the first semiconductor layer, a second semiconductor layer including an oxide semiconductor, and disposed on the first insulation layer, wherein the first conductive layer is a first electrode of a first capacitor, the first semiconductor layer is a second electrode of the first capacitor and a first electrode of a second capacitor, and the second semiconductor layer is a second electrode of the second capacitor.

24 Claims, 14 Drawing Sheets

(56) References Cited

U.S. PATENT DOCUMENTS

| | | | | |
|---|---|---|---|---|
| 2021/0376032 | A1 | 12/2021 | Kim et al. | |
| 2022/0115479 | A1 | 4/2022 | Miyamoto et al. | |
| 2022/0157909 | A1* | 5/2022 | Kim | H10D 30/6723 |
| 2022/0173191 | A1* | 6/2022 | Kim | H10K 59/1213 |
| 2022/0181418 | A1* | 6/2022 | Huang | H10D 30/031 |
| 2023/0065335 | A1* | 3/2023 | Kim | H10D 86/423 |
| 2023/0189570 | A1* | 6/2023 | Lin | H10K 59/80521 257/40 |

FOREIGN PATENT DOCUMENTS

| | | |
|---|---|---|
| KR | 10-1833235 | 4/2018 |
| KR | 10-2018-0061720 A | 6/2018 |
| KR | 10-2021-0126187 | 10/2021 |
| KR | 10-2022-0077322 A | 6/2022 |

* cited by examiner

DISPLAY DEVICE

CROSS-REFERENCE TO RELATED APPLICATION(S)

This application claims priority to and benefits of Korean Patent Application No. 10-2022-0119315 under 35 U.S.C. § 119, filed on Sep. 21, 2022, the entire contents of which are incorporated hereby by reference.

BACKGROUND

1. Technical Field

Embodiments relate to a display device with an oxide transistor.

2. Description of the Related Art

A display device includes a plurality of pixels and a driving circuit (e.g., a scan driving circuit and a data driving circuit) for controlling the plurality of pixels. Each of the plurality of pixels includes a display element and a driving circuit of a pixel for controlling the display element. The driving circuit of the pixel may include a plurality of transistors organically connected.

The scan driving circuit, the data driving circuit and/or the plurality of pixels may be formed by the same process. The scan driving circuit and/or the data driving circuit may include a plurality of transistors organically connected.

SUMMARY

Embodiments provide a display panel with improved display quality.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include a base layer, a first conductive layer disposed on the base layer, an inorganic layer disposed on the first conductive layer, a first semiconductor layer disposed on the inorganic layer, and including an oxide semiconductor, a first insulation layer disposed on the first semiconductor layer, and a second semiconductor layer including an oxide semiconductor, and disposed on the first insulation layer. The first conductive layer may be a first electrode of a first capacitor, the first semiconductor layer may be a second electrode of the first capacitor and a first electrode of a second capacitor, and the second semiconductor layer may be a second electrode of the second capacitor.

In an embodiment, the first conductive layer may include a (1-1)th conductive pattern layer and a (1-2)th conductive pattern layer which are spaced apart from each other in a plan view, and the first semiconductor layer may include a (1-1)th semiconductor pattern layer and a (1-2)th semiconductor pattern layer which are spaced apart from each other in a plan view. The second semiconductor layer may include a (2-1)th semiconductor pattern layer and a (2-2)th semiconductor pattern layer which are spaced apart from each other in a plan view. Each of the (1-1)th semiconductor pattern layer, the (1-2)th semiconductor pattern layer, and the (2-2)th semiconductor pattern layer may overlap the (1-1)th conductive pattern layer in a plan view, and the (2-1)th semiconductor pattern layer may overlap the (1-2)th conductive pattern layer in a plan view.

In an embodiment, the (1-1)th conductive pattern layer may be the first electrode of the first capacitor, the (1-2)th semiconductor pattern layer may be the second electrode of the first capacitor and the first electrode of the second capacitor, and the (2-2)th semiconductor pattern layer may be the second electrode of the second capacitor.

In an embodiment, the (1-1)th semiconductor pattern layer may include a source region, a drain region, and a channel region, wherein in a plan view, the first insulation layer may overlap the entire surface of the (1-2)th semiconductor pattern layer and the channel region of the (1-1)th semiconductor pattern layer, and may not overlap the source region and the drain region of the (1-1)th semiconductor pattern layer.

In an embodiment, the display device may further include a second insulation layer disposed on the second semiconductor layer, a second conductive layer disposed on the second insulation layer, and a third insulation layer disposed on the second conductive layer.

In an embodiment, the (2-1)th semiconductor pattern layer may include a source region, a drain region, and a channel region, wherein the second insulation layer may include a (2-1)th insulation pattern layer overlapping the channel region of the (1-1)th semiconductor pattern layer and a (2-2)th insulation pattern layer overlapping the channel region of the (2-1)th semiconductor pattern layer.

In an embodiment, the second conductive layer may include a (2-1)th conductive pattern layer overlapping the channel region of the (1-1)th semiconductor pattern layer in a plan view, and a (2-2)th conductive pattern layer overlapping the channel region of the (2-1)th semiconductor pattern layer in a plan view.

In an embodiment, the thickness of the first insulation layer may be less than the thickness of the third insulation layer.

In an embodiment, the display device may further include a fourth insulation layer disposed on the third insulation layer and a light emitting element disposed on the fourth insulation layer, wherein the light emitting element may include a first electrode, a light emitting layer, and a second electrode which are disposed on the fourth insulation layer, and the first electrode of the light emitting element may be electrically connected to the (1-1)th semiconductor pattern layer.

In an embodiment, the display device may further include a third conductive layer disposed on the third insulation layer, wherein the (2-2)th semiconductor pattern layer may be a first electrode of a third capacitor, and the third conductive layer may be a second electrode of the third capacitor.

In an embodiment, the first conductive layer may include a (1-1)th conductive pattern layer and a (1-2)th conductive pattern layer which are spaced apart from each other in a plan view, the first semiconductor layer may include a (1-1)th semiconductor pattern layer and a (1-2)th semiconductor pattern layer which are spaced apart from each other in a plan view, the (1-1)th semiconductor pattern layer and (1-2)th semiconductor pattern layer may each overlap the (1-1)th conductive pattern layer in a plan view, and the second semiconductor layer may overlap the (1-2)th conductive pattern layer in a plan view.

In an embodiment, the (1-1)th semiconductor pattern layer may include a source region, a drain region, and a channel region, wherein in a plan view, the first insulation layer may overlap the entire surface of the (1-2)th semiconductor pattern layer and the channel region of the (1-1)th semiconductor pattern layer, and may not overlap the source region and the drain region of the (1-1)th semiconductor pattern layer.

In an embodiment, the display device may further include a second insulation layer disposed on the second semiconductor layer, and a second conductive layer disposed on the second insulation layer, wherein in a plan view, the second insulation layer may include a (2-1)th insulation pattern layer, a (2-2)th insulation pattern layer, and a (2-3)th insulation pattern layer respectively overlapping the (1-2)th semiconductor pattern layer, the (1-1)th semiconductor pattern layer, and the second semiconductor layer, and in a plan view, the second conductive layer may include a (2-3)th conductive pattern layer, a (2-1)th conductive pattern layer, and a (2-2)th conductive pattern layer respectively overlapping the (2-1)th insulation pattern layer, the (2-2)th insulation pattern layer, and the (2-3)th insulation pattern layer.

In an embodiment, the (1-1)th conductive pattern layer may be the first electrode of the first capacitor, the (1-2)th semiconductor pattern layer may be the second electrode of the first capacitor and the first electrode of the second capacitor, and the (2-3)th conductive pattern layer may be the second electrode of the second capacitor.

In an embodiment, the display device may further include a third insulation layer disposed on the second conductive layer, and a third conductive layer disposed on the third insulation layer. In an embodiment, the (2-3)th conductive pattern layer may be a first electrode of a third capacitor, and the third conductive layer may be a second electrode of the third capacitor.

In an embodiment, a display device may include a display panel including a plurality of insulation layers and a pixel electrically connected to a first data line extended in a first direction and a first scan line extended in a second direction intersecting the first direction. In an embodiment, the pixel may include a first capacitor electrically connected between a first node and a second node, a light emitting diode including a first electrode electrically connected to the second node, a second electrode electrically connected to a first voltage line that receives a first power voltage, and a light emitting layer disposed between the first electrode and the second electrode, a first transistor electrically connected between the second node and a second voltage line that receives a second power voltage, the first transistor including a source, a drain, a channel region, and a gate electrically connected to the first node, a second transistor electrically connected between the first data line and the first node, a third transistor electrically connected between the first node and a third voltage line that receives a first voltage, a fourth transistor electrically connected between the second node and a fourth voltage line that receives a second voltage, a fifth transistor electrically connected between the second voltage line and the drain or the source of the first transistor, and a second capacitor electrically connected between the second voltage line and the second node. The plurality of insulation layers may include an inorganic layer, a first insulation layer disposed on the inorganic layer, and a second insulation layer disposed on the first insulation layer, and the display panel may further include a first conductive layer, a first semiconductor layer, a second semiconductor layer, and a second conductive layer, wherein the first conductive layer being a first electrode of the first capacitor may be disposed on a lower surface of the inorganic layer, the first semiconductor layer being a second electrode of the first capacitor and a first electrode of the second capacitor may be disposed between the inorganic layer and the first insulation layer, the second semiconductor layer being a second electrode of the second capacitor may be disposed on an upper surface of the second insulation layer, and each of the first semiconductor layer and the second semiconductor layer may include an oxide semiconductor.

In an embodiment, the first semiconductor layer may include a (1-1)th semiconductor pattern layer including the source, the drain, and the channel region of the first transistor, and a (1-2)th semiconductor pattern layer including the second electrode of the first capacitor and the first electrode of the second capacitor.

In an embodiment, the display panel may further include a third insulation layer disposed on the second insulation layer and a second conductive layer disposed on the third insulation layer, wherein the second conductive layer may be the gate of the first transistor.

In an embodiment, the display panel may further include a fourth insulation layer disposed on the second conductive layer and a third conductive layer disposed on the fourth insulation layer, and the pixel may further include a third capacitor, wherein the second semiconductor layer may be a first electrode of the third capacitor, and the third conductive layer may be a second electrode of the third capacitor.

In an embodiment, a display device may include a display panel including a plurality of insulation layers and a pixel electrically connected to a first data line extended in a first direction and a first scan line extended in a second direction intersecting the first direction. The pixel may include a first capacitor electrically connected between a first node and a second node, a light emitting diode including a first electrode electrically connected to the second node, a second electrode electrically connected to a first voltage line that receives a first power voltage, and a light emitting layer disposed between the first electrode and the second electrode, a first transistor electrically connected between the second node and a second voltage line that receives a second power voltage, the first transistor including a source, a drain, a channel region, and a gate electrically connected to the first node, and, a second transistor electrically connected between the first data line and the first node, a third transistor electrically connected between the first node and a third voltage line that receives a first voltage, a fourth transistor electrically connected between a fourth voltage line that receives a second voltage and the second node, a fifth transistor electrically connected between the second voltage line and the drain or the source of the first transistor, and a second capacitor electrically connected between the second voltage line and the second node.

In an embodiment, the plurality of insulation layers may include an inorganic layer, a first insulation layer disposed on the inorganic layer, and a second insulation layer disposed on the first insulation layer, and the display panel may further include a first conductive layer, a first semiconductor layer, a second semiconductor layer, and a second conductive layer, wherein the first conductive layer being a first electrode of the first capacitor may be disposed on a lower surface of the inorganic layer, the first semiconductor layer being a second electrode of the first capacitor and a first electrode of the second capacitor may be disposed between the inorganic layer and the first insulation layer, the second semiconductor layer may be disposed between the first insulation layer and the second insulation layer and disposed spaced apart from the first semiconductor layer in a plan view, the second conductive layer being a second electrode of the second capacitor may be disposed on an upper surface of the second insulation layer, and each of the first semiconductor layer and the second semiconductor layer may include an oxide semiconductor.

In an embodiment, the first semiconductor layer may include a (1-1)th semiconductor pattern layer including the source, the drain, and the channel region of first transistor, and a (1-2)th semiconductor pattern layer including the second electrode of the first capacitor and the first electrode of the second capacitor.

In an embodiment, the second conductive layer may include a (2-3)th conductive pattern layer overlapping the (1-2)th semiconductor pattern layer in a plan view and defining the second electrode of the second capacitor, and a (2-1)th conductive pattern layer overlapping the channel region of the first transistor in a plan view, and defining the gate of the first transistor.

In an embodiment, the second semiconductor layer may be a source, a drain, and a channel region of the second transistor, and the second conductive layer may further include a (2-2)th conductive pattern layer overlapping a channel region of the second semiconductor layer in a plan view, and being a gate of the second transistor.

In an embodiment, the display panel may further include a fourth insulation layer disposed on the second conductive layer and a third conductive layer disposed on the fourth insulation layer. The pixel may further include a third capacitor, wherein the (2-3)th conductive pattern layer may be a first electrode of the third capacitor, and the third conductive layer may be a second electrode of the third capacitor.

BRIEF DESCRIPTION OF THE DRAWINGS

The accompanying drawings are included to provide a further understanding of the invention, and are incorporated in and form a part of this specification. The drawings illustrate embodiments and, together with the description, serve to explain principles of the invention. In the drawings.

DETAILED DESCRIPTION OF THE EMBODIMENTS

Figure 1:
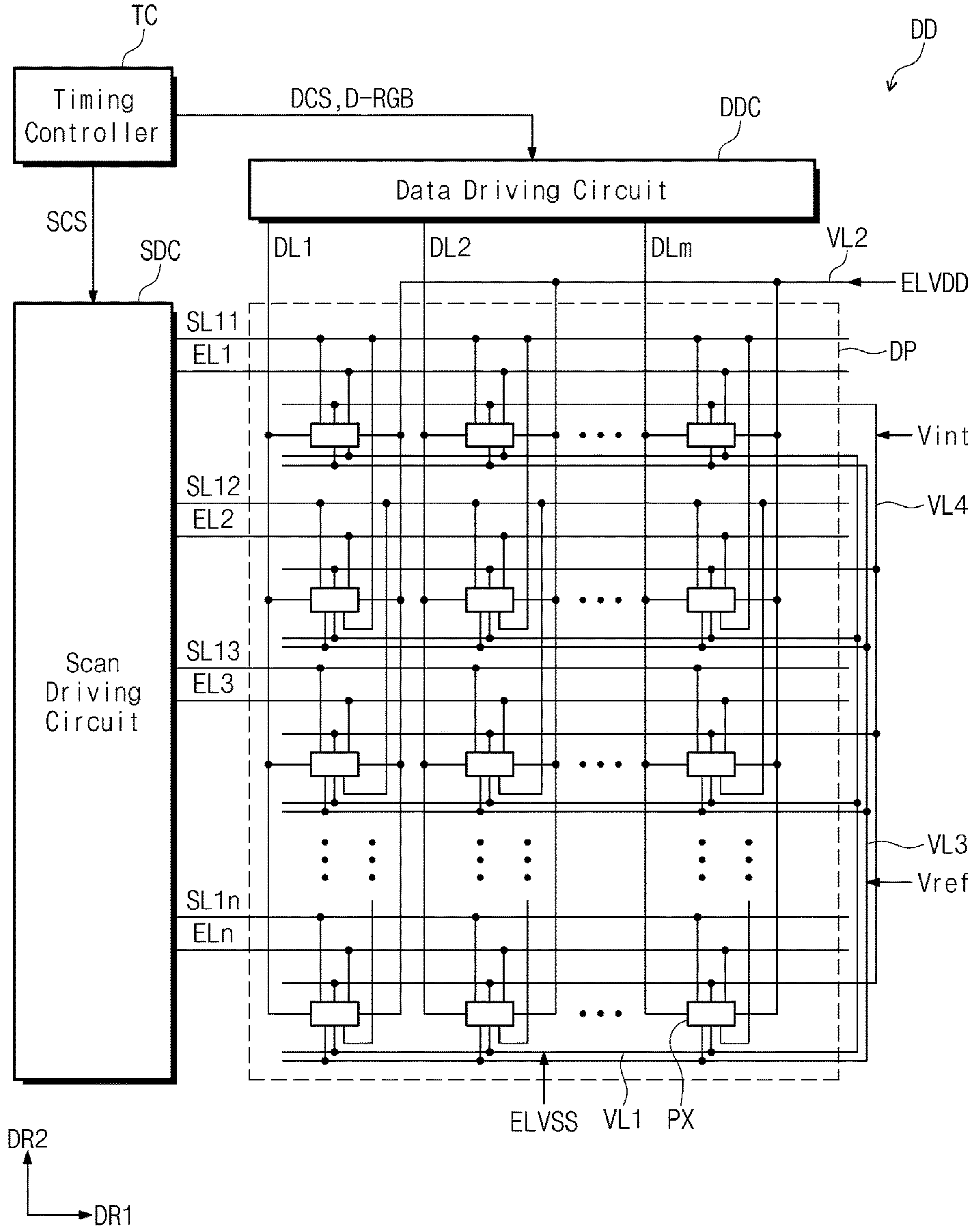
FIG. 1 is a schematic block diagram of a display device according to an embodiment.

In the disclosure, when an element (or a region, a layer, a portion, and the like) is referred to as being "on," "connected to," or "coupled to" another element, it means that the element may be directly disposed on/connected to/coupled to the other element, or that a third element may be disposed therebetween.

Like reference numerals refer to like elements. In the drawings, the thickness, the ratio, and the dimensions of elements are exaggerated for an effective description of technical contents. The term "and/or," includes all combinations of one or more of which associated components may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, embodiments will be described with reference to the accompanying drawings.

FIG. 1 is a schematic block diagram of a display device DD according to an embodiment. The display device DD may include a timing controller TV, a scan driving circuit SDC, a data driving circuit DDC, and a display panel DP. In an embodiment, the display panel DP is described as a light emitting-type display panel. The light emitting-type display panel may include an organic light emitting display panel or an inorganic light emitting display panel. The light emitting-type display panel may include a micro-LED display panel, and a micro-OLED display panel or a nano-LED display panel.

The timing controller TC may receive input image signals, and may convert a data format of the input image signals according to interface specifications with the scan driving circuit SDC, thereby generating image data D-RGB. The timing controller TC may output the image data D-RGB and various control signals DCS and SCS.

The scan driving circuit SDC may receive a scan control signal SCS from the timing controller TC. The scan control signal SCS may include a vertical start signal for starting the operation of the scan driving circuit SDC, a clock signal for determining the output timing of signals, and the like. The scan driving circuit SDC may generate scan signals, and sequentially may output the scan signals to corresponding scan signal lines SL11 to SL1$n$. For example, the scan driving circuit SDC may generate light emission control signals in response to the scan control signal SCS, and may output the light emission control signals to corresponding light emission signal lines EL1 to ELn.

In FIG. 1, scan signals and light emission control signals are illustrated as being output from a scan driving circuit SDC, but embodiments are not limited thereto. In an embodiment, the display device DD may include scan driving circuits. In an embodiment, a driving circuit for generating and outputting scan signals and a driving circuit for generating and outputting light emission control signals may be separately formed.

The data driving circuit DDC may receive a data control signal DCS and the image data D-RGB from the timing controller TC. The data driving circuit DDC may convert the image data D-RGB into data signals, and may output the data signals to data lines DL1 to DLm to be described below. The data signals may be analog voltages corresponding to a gray scale value of the image data D-RGB.

The display panel DP may include a plurality groups of scan lines. In FIG. 1, scan signal lines SL11 to SL1*n* of a first group are illustrated. The display panel DP may include the light emission signal lines EL1 to ELn, the data lines DL1 to DLm, a first voltage line VL1, a second voltage line VL2, a third voltage line VL3, a fourth voltage line VL4, and pixels PX.

The scan signal lines SL11 to SL1*n* of the first group may be extended in a first direction DR1, and may be arranged in a second direction DR2. The data lines DL1 to DLm may cross (or intersect) the scan signal lines SL11 to SL1*n* of the first group.

The first voltage line VL1 may receive a first power voltage ELVSS. The second voltage line VL2 may receive a second power voltage ELVDD. The second power voltage ELVDD may have a higher level than the first power voltage ELVSS. The third voltage line VL3 may receive a reference voltage Vref (hereinafter, a first voltage). The fourth voltage line VL4 may receive an initialization voltage Vint (hereinafter, a second voltage). The first voltage Vref may have a lower level than the second power voltage ELVDD. The second voltage Vint may have a lower level than the second power voltage ELVDD. In an embodiment, the second voltage Vint may have a lower level than the first voltage Vref and the first power voltage ELVSS.

At least one of the first voltage line VL1, the second voltage line VL2, the third voltage line VL3, or the fourth voltage line VL4 may include at least one of a line extended in the first direction DR1 and a line extended in the second direction DR2. A line extended in the first direction DR1 of a voltage line and a line extended in the second direction DR2 thereof may be electrically connected to each other although they are disposed on different layers from each other among insulation layers 10 to 40 illustrated in FIG. 4.

In the above, the display device DD according to an embodiment has been described with reference to FIG. 1, but the display device DD is not limited thereto. Signal lines may be further added, or omitted according to the configuration of a pixel driving circuit. For example, the electrical connection structure between a pixel PX and signal lines may be changed.

The pixels PX may include a plurality of groups which generate light of different colors. For example, the pixels PX may include red pixels which generate light of a red color, green pixels which generate light of a green color, and blue pixels which generate light of a blue color. A light emitting diode of a red pixel, a light emitting diode of a green pixel, and a light emitting diode of a blue pixel may include a light emitting layer formed of different materials.

The pixel driving circuit may include transistors and at least one capacitor. At least one of the scan driving circuit SDC and the data driving circuit DDC may include transistors formed by the same process as a process for forming the pixel driving circuit.

By performing a photolithography process and an etching process a plurality of times, the above-described signal lines, the pixels PX, the scan driving circuit SDC, and the data driving circuit DDC may be formed on a base substrate.

Through performing a deposition process or a coating process a plurality of times, insulation layers on the base substrate may be formed. The insulation layers may include an organic layer and/or an inorganic layer. Any one of the insulation layers may include insulation pattern layers. Each of the insulation layers may overlap the pixels PX. A contact-hole may be formed in each of the insulation layers. The contact-holes may be arranged by a certain rule for each of the pixels PX.

Figure 2:
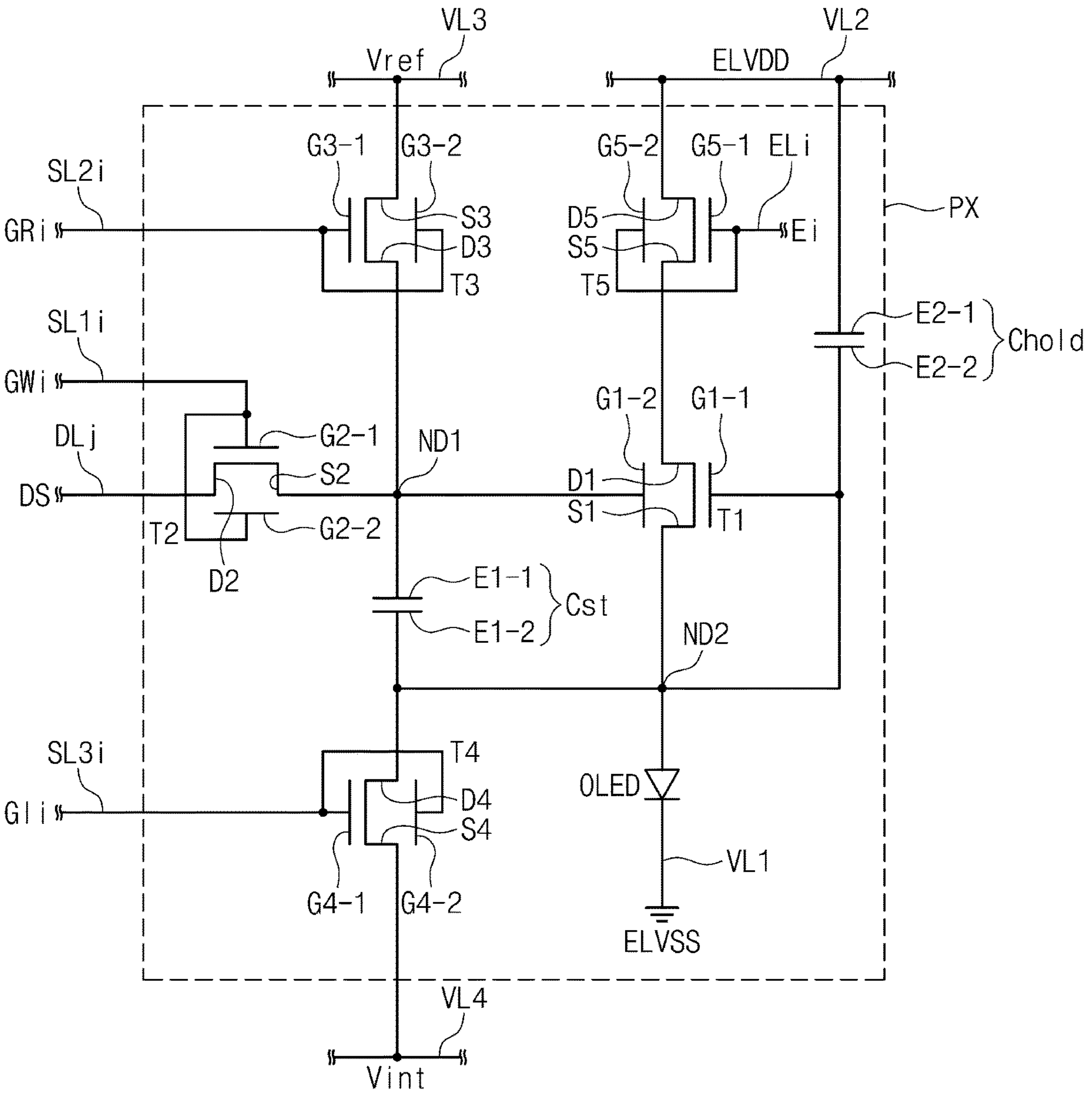
FIG. 2 is a schematic diagram of an equivalent circuit of a pixel according to an embodiment.
Figure 3:
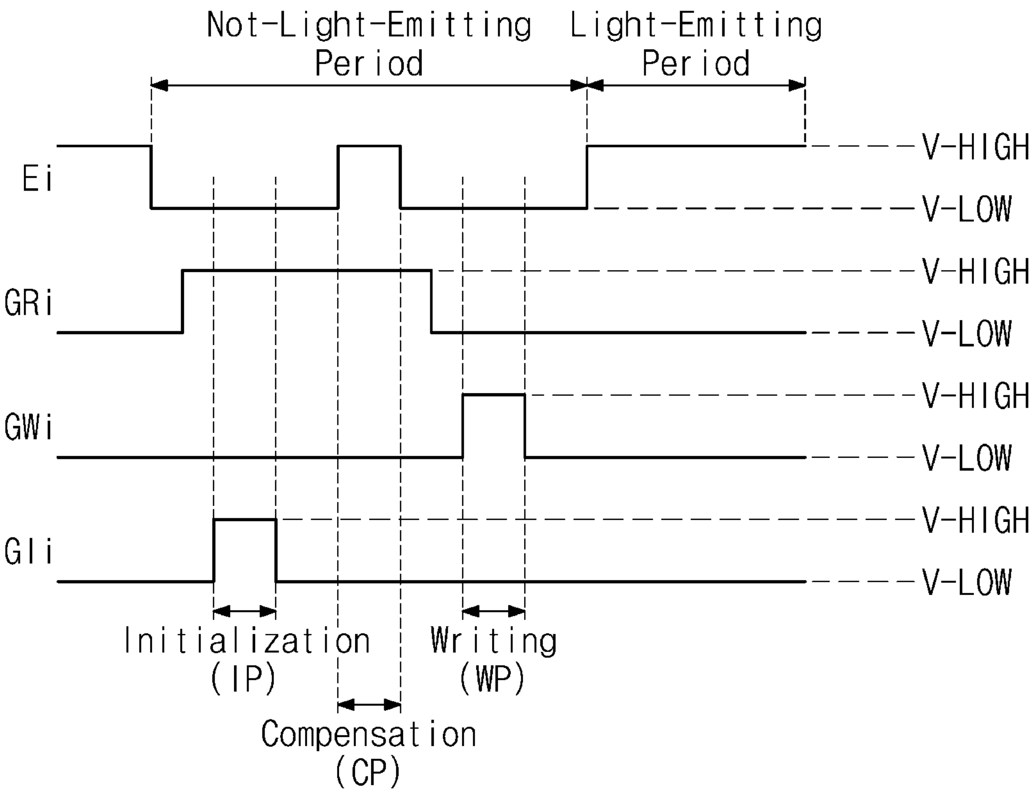
FIG. 3 is a waveform diagram of driving signals for driving the pixel shown in FIG. 2.

FIG. 2 is a schematic diagram of an equivalent circuit of a pixel PX according to an embodiment. FIG. 3 is a waveform diagram of driving signals for driving the pixel PX shown in FIG. 2.

FIG. 2 representatively illustrates a pixel PX connected to an i-th scan line SL1*i* (or a first scan line) among the scan lines SL11 to SL1*n* (see FIG. 1) of the first group, and connected to a j-th data line DLj (or a first data line) among the data lines DL1 to DLm (see FIG. 1). The pixel PX may be connected to an i-th scan line SL2*i* among scan lines of a second group, and may be connected to an i-th scan line SL3*i* among scan lines of a third group.

In an embodiment, the pixel driving circuit may include first to fifth transistors T1 to T5, a storage capacitor Cst, a hold capacitor Chold, and a light emitting diode OLED. In an embodiment, the first to fifth transistors T1 to T5 are described as N-type transistors. However, embodiments are not limited thereto, and at least one of the first to fifth transistors T1 to T5 may be a P-type transistor. In another example, at least one of the first to fifth transistors T1 to T5 may be omitted, or an additional transistor may be further included in the pixel PX.

In an embodiment, each of the first to fifth transistors T1 to T5 is illustrated as including two gates, but at least one transistor may include a single gate. Second, third, fourth, and fifth upper gates G2-1, G3-1, G4-1, and G5-1 and second, third, fourth, and fifth lower gates G2-2, G3-2, G4-2, and G5-2 of respective second to fifth transistors T2 to T5 are illustrated as being electrically connected to each other, but embodiments are not limited thereto. The second, third, fourth, and fifth lower gates G2-2, G3-2, G4-2, and G5-2 of the respective second to fifth transistors T2 to T5 may be a floated electrode.

In an embodiment, the first transistor T1 may be a driving transistor, and the second transistor T2 may be a switching transistor. A node to which a gate G1-2 of the first transistor T1 is connected may be defined as a first node ND1, and a node to which a source S1 of the first transistor T1 is connected may be defined as a second node ND2.

The light emitting diode OLED may include a first electrode which is electrically connected to the second node ND2, a second electrode which receives the first power voltage ELVSS, and a light emitting layer which is disposed between the first electrode and the second electrode. The light emitting diode OLED will be described in detail below.

The first transistor T1 may be electrically connected between the second voltage line VL2, which receives the second power voltage ELVDD, and the second node ND2. The first transistor T1 may include the source S1 (hereinafter, a first source) connected to the second node ND2, a drain D1 (hereinafter, a first drain), a channel, and the gate G1-1 (hereinafter, a first upper gate) which is electrically connected to the second node ND2. The first transistor T1 may further include a gate G1-2 (hereinafter, a first lower gate) connected to the first node ND1.

The second transistor T2 may be electrically connected between the j-th data line DLj and the first node ND1. The second transistor T2 may include a source S2 (hereinafter, a second source) connected to the first node ND1, a drain D2 (hereinafter, a second drain) connected to the j-th data line DLj, a channel, and a gate G2-1 (hereinafter, a second upper gate) which is connected to the i-th scan line SL1*i* of the first group. The second transistor T2 may further include a gate G2-2 (hereinafter, a second lower gate) electrically connected to the second upper gate G2-1. The third to fifth transistors T3 to T5 to be described below may respectively include upper gates G3-1, G4-1, and G5-1 and lower gates G3-2, G4-2, and G5-2 corresponding to the second upper gate G2-1 and the second lower gate G2-2.

The third transistor T3 may be electrically connected between the first node ND1 and the third voltage line VL3 which receives the first voltage Vref. The third transistor T3 may include a drain D3 (hereinafter, a third drain) connected to the first node ND1, a source S3 (hereinafter, a third source) connected the third voltage line VL3, a channel, and a third upper gate G3-1 which is connected to the i-th scan line SL2*i* of the second group.

The fourth transistor T4 may be electrically connected between the fourth voltage line VL4, which receives the second voltage Vint, and the second node ND2. The fourth transistor T4 may include a drain D4 (hereinafter, a fourth drain) connected to the second node ND2, a source S4 (hereinafter, a fourth source) connected the fourth voltage line VL4, a channel, and a fourth upper gate G4-1 which is connected to the i-th scan line SL3*i* of the third group.

The fifth transistor T5 may be electrically connected between the second voltage line VL2 and the first drain D1 or the first source S1. In an embodiment, the fifth transistor T5 may include a source S5 (hereinafter, a fifth source) connected to the second voltage line VL2, a drain D5 (hereinafter, a fifth drain) connected the first drain D1, a channel, and a fifth upper gate G5-1 connected to an i-th light emission signal line ELi.

The storage capacitor Cst may be electrically connected between the first node ND1 and the second node ND2. The storage capacitor Cst may include a first electrode E1-1 connected to the first node ND1 and a second electrode E1-2 connected to the second node ND2.

The hold capacitor Chold may be electrically connected between the second voltage line VL2 and the second node ND2. The hold capacitor Chold may include a first electrode E2-1 connected to the second voltage line VL2 and a second electrode E2-2 connected to the second node ND2.

Referring to FIG. 2 and FIG. 3 together, the operation of the pixel PX will be described in more detail. The display device DD (see FIG. 1) may display an image for each frame period. Each of the scan lines of the first group, the scan lines of the second group, the scan lines of the third group, and the light emission signal lines may be sequentially scanned during the frame period. FIG. 3 illustrates a portion of a frame period.

Referring to FIG. 3, each of signals Ei, GRi, GWi, and GIi may have a high level V-HIGH during some periods, and may have a low level V-LOW during some periods. The above-described N-type first to fifth transistors T1 to T5 may be turned on in case that a corresponding control signal has the high level V-HIGH.

During an initialization period IP, the third transistor T3 and the fourth transistor T4 may be turned on. The first node ND1 may be initialized to the first voltage Vref. The second node ND2 may be initialized to the second voltage Vint. The storage capacitor Cst may be initialized to a value corresponding to the difference between the first voltage Vref and the second voltage Vint. The hold capacitor Chold may be initialized to a value corresponding to the difference between the second power voltage ELVDD and the second voltage Vint.

During a compensation period CP, the third transistor T3 and the fifth transistor T5 may be turned on. The storage capacitor Cst may be compensated with a voltage corresponding to a threshold voltage of the first transistor T1.

During a writing period WP, the second transistor T2 may be turned on. The second transistor T2 may output a voltage corresponding to a data signal DS. As a result, the storage capacitor Cst may be charged with a voltage value corresponding to the data signal DS. The storage capacitor Cst may be charged with the data signal DS compensated with the threshold voltage of the first transistor T1. A threshold voltage of a driving transistor may be different for each pixel PX (see FIG. 1), but the pixel PX illustrated in FIG. 2 and FIG. 3 may supply a current of a size proportional to the data signal DS to the light emitting diode OLED regardless of the deviation of threshold voltages of driving transistors.

Thereafter, during a light emission period, the fifth transistor T5 may be turned on. The first transistor T1 may provide a current corresponding to a value of a voltage stored in the storage capacitor Cst to the light emitting diode OLED. The light emitting diode OLED may emit light to a luminance corresponding to the data signal DS.

Figure 4:
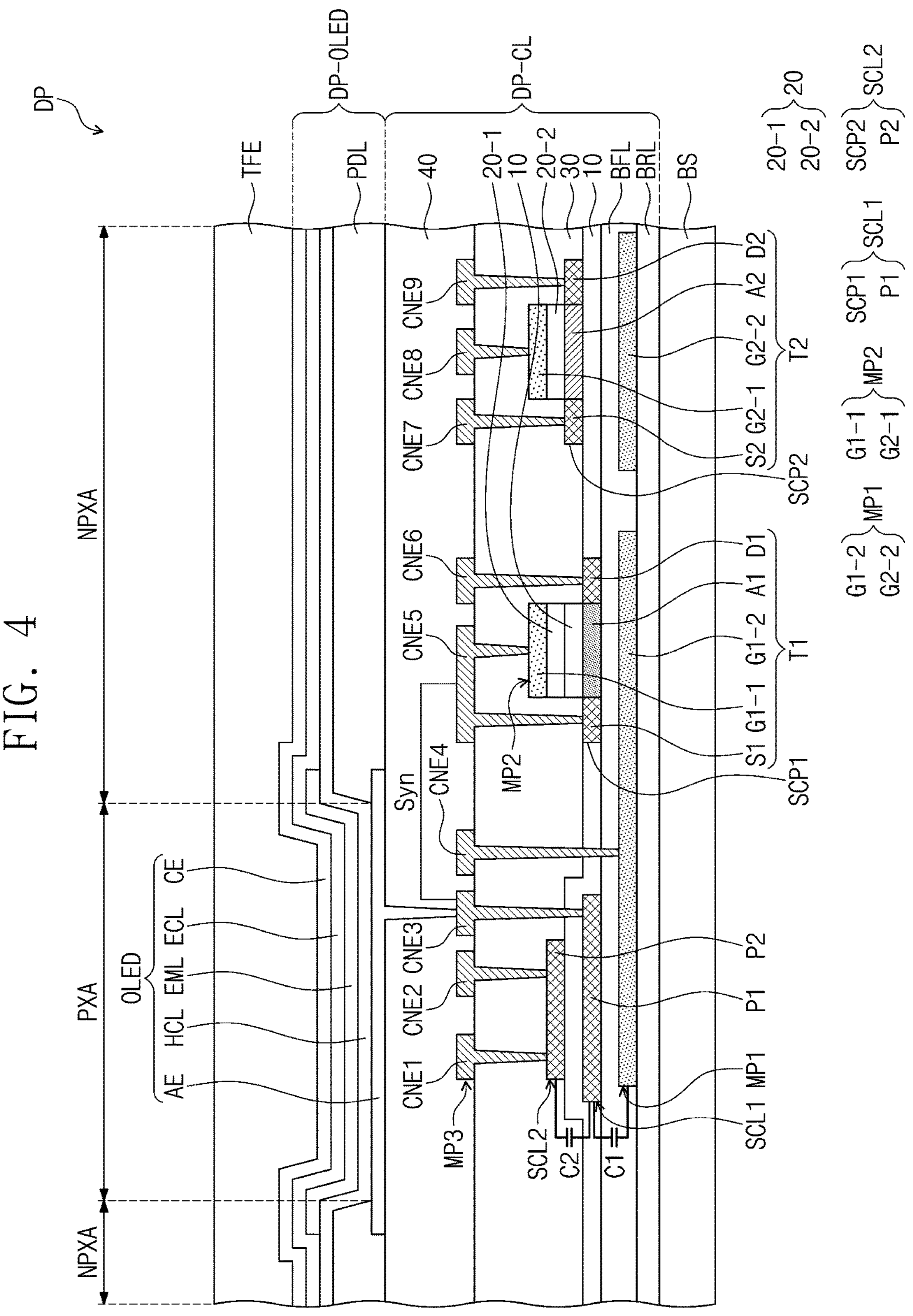
FIG. 4 is a schematic cross-sectional view of a display panel according to an embodiment.

FIG. 4 is a schematic diagram illustrating the display panel DP according to an embodiment. In the display panel DP having the equivalent circuit of the pixel PX illustrated in FIG. 2, FIG. 4 illustrates a cross-section of a portion corresponding to the first transistor T1, the second transistor T2, a first capacitor C1, a second capacitor C2, and the light emitting diode OLED.

Referring to FIG. 4, the display panel DP may include a base layer BS, a circuit element layer DP-CL, a display element layer DP-OLED, and a thin film encapsulation layer TFE. The display panel DP may further include functional layers such as an anti-reflection layer or a refractive index control layer. The circuit element layer DP-CL may include insulation layers and a circuit element. Hereinafter, insulation layers to be described below may include an organic layer and/or an inorganic layer.

An insulation layer, a semiconductor layer and a conductive layer may be formed by a process such as a coating process, a deposition process, and the like. Thereafter, the insulation layer, the semiconductor layer, and the conductive layer may be selectively patterned through a photolithography process and an etching process. By such processes, a semiconductor pattern layer, a conductive pattern layer, a signal line, and the like may be formed. Pattern layers disposed on the same layer may be formed by the same process.

The base layer BS may be a synthetic resin layer including a synthetic resin. The synthetic resin layer may include a thermosetting resin. For example, the synthetic resin layer may be a polyimide-based resin layer, and the material of the base layer BS is not limited. The synthetic resin layer may include at least one of an acrylic resin, a methacrylic resin, a polyisoprene-based resin, a vinyl-based resin, an epoxy-based resin, a urethane-based resin, a cellulose-based resin, a siloxane-based resin, a polyamide-based resin, or a perylene-based resin. For example, the base layer BS may include a glass substrate, a metal substrate, an organic/inorganic composite material substrate, or the like.

At least one inorganic layer may be disposed on an upper surface of the base layer BS. The inorganic layer may include at least one of an aluminum oxide, a titanium oxide, a silicon oxide, a silicon nitride, a silicon oxynitride, a zirconium oxide, or a hafnium oxide. The inorganic layer may be formed as a multi-layered inorganic layer. Multi-layered inorganic layers may form a barrier layer BRL and/or a buffer layer BFL (or an inorganic layer) to be described below. The barrier layer BRL and the buffer layer BFL may be selectively disposed.

The barrier layer BRL may prevent foreign substances from being introduced from the outside. The barrier layer BRL may include a silicon oxide layer and a silicon nitride layer. Each of the silicon oxide layer and the silicon nitride layer may be provided in plurality, and silicon oxide layers and silicon nitride layers may be alternately laminated.

A first conductive layer MP1 may be disposed on the barrier layer BRL. The first conductive layer MP1 may include conductive pattern layers. FIG. 4 illustrates some of the conductive pattern layers of the first conductive layer MP1. The first lower gate G1-2 and the second lower gate G2-2 are illustrated as an example of conductive pattern layers of the first conductive layer MP1. The first lower gate G1-2 and the second lower gate G2-2 may respectively be a (1-1)th conductive pattern layer and a (1-2)th conductive pattern layer.

The first lower gate G1-2 may be a first electrode of the first capacitor C1. The first capacitor C1 may be the storage capacitor Cst illustrated in FIG. 2, and the first electrode of the first capacitor C1 may be the first electrode E1-1 of the storage capacitor Cst illustrated in FIG. 2.

Some regions of the (1-1)th conductive pattern layer may correspond to the first lower gate G1-2, and other regions thereof may correspond to the first electrode E1-1 of the storage capacitor Cst illustrated in FIG. 2. The first electrode E1-1 of the storage capacitor Cst and the first lower gate G1-2 may have a shape of a single body (or may be integral with each other).

The above-described first lower gate G1-2 and the above-described second lower gate G2-2 have a function of a light blocking pattern layer. The first lower gate G1-2 and the second lower gate G2-2 may be respectively disposed on a lower surface of a channel region A1 of the first transistor T1 and on a lower surface of a channel region A2 of the second transistor T2, which are to be described below, and may block light incident from the outside. The light blocking pattern layer may prevent external light from changing voltage-current properties of each of the first transistor T1 and the second transistor T2.

The buffer layer BFL may be disposed on the barrier layer BRL to cover the first lower gate G1-2 and the second lower gate G2-2. The buffer layer BFL may improve the bonding force between the base layer BS and a semiconductor pattern layer and/or a conductive pattern layer. The buffer layer BFL may an inorganic layer. In an embodiment, the buffer layer BFL may include a silicon oxide layer and a silicon nitride layer. The silicon oxide layer and the silicon nitride layer may be alternately laminated.

A first semiconductor layer SCL1 may be disposed on the buffer layer BFL. The first semiconductor layer SCL1 may include semiconductor pattern layers. FIG. 4 illustrates two semiconductor pattern layers SCP1 and P1 as an example of the first semiconductor layer SCL1.

The semiconductor pattern layer may include a metal oxide semiconductor and an oxide semiconductor. The metal oxide semiconductor may include a crystalline or amorphous oxide semiconductor. For example, the oxide semiconductor may include a metal oxide including zinc (Zn), indium (In), gallium (Ga), tin (Sn), titanium (Ti), or the like, or a mixture of a metal such as zinc (Zn), indium (In), gallium (Ga), tin (Sn), titanium (Ti), or the like and an oxide thereof. The oxide semiconductor may include an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), a zinc-tin oxide (ZTO), and the like.

The semiconductor pattern layer may include regions distinguished according to whether a metal oxide is reduced or not. A region in which the metal oxide is reduced (hereinafter, a reduction region) may have greater conductivity than a region in which the metal oxide is not reduced (hereinafter, a non-reduction region). The reduction region may substantially function as a source/drain or a signal line or an electrode of a transistor. The non-reduction region may substantially correspond to a channel region (or a channel) of the transistor. As illustrated in FIG. 4, a first pattern layer SCP1 of the first semiconductor layer SCL1 may include a source region S1, a channel region A1, and a drain region D1 of the first transistor T1. The source region S1 and the drain region D1 of the first transistor T1 functionally correspond to the source S1 and the drain D1 of the first transistor T1 described with reference to FIG. 2, and thus refer to the same reference numerals.

The source region S1 and the drain region D1 of the first transistor T1 may be extended in an opposite direction from the channel region A1. The first pattern layer SCP1 of the first semiconductor layer SCL1 may be reduced, thereby including the source region S1 and the drain region D1 which are relatively high in conductivity, and may not be reduced, thereby including the channel region A1 which is relatively low in conductivity.

As illustrated in FIG. 4, a second pattern layer P1 of the first semiconductor layer SCL1 may not be reduced, thereby being relatively low in conductivity, or may be reduced, thereby being relatively high in conductivity. The conductivity of the second pattern layer P1 of the first semiconductor layer SCL1 may be determined according to whether a doping process is performed. The first pattern layer SCP1 and the second pattern layer P1 of the first semiconductor layer SCL1 may be a (1-1)th semiconductor pattern layer and a (1-2)th semiconductor pattern layer, respectively.

The second pattern layer P1 of the first semiconductor layer SCL1 may be a second electrode of the first capacitor C1 and a first electrode of the second capacitor C2. For example, the second pattern layer P1 of the first semiconductor layer SCL1 may be the second electrode of the first capacitor C1, as well as the first electrode of the second capacitor C2. The second electrode of the first capacitor C1 may be the second electrode E1-2 of the storage capacitor Cst illustrated in FIG. 2.

For example, the second capacitor C2 may be the hold capacitor Chold illustrated in FIG. 2. The first electrode of the second capacitor C2 may be the second electrode E2-2 of the hold capacitor Chold illustrated in FIG. 2.

In an embodiment, in a cross-section, the first pattern layer SCP1 of the first semiconductor layer SCL1 is illustrated as being spaced apart from the second pattern layer P1 of the first semiconductor layer SCL1, but embodiments are not limited thereto. The first pattern layer SCP1 of the first semiconductor layer SCL1 and the second pattern layer P1 of the first semiconductor layer SCL1 may have a shape of a single body on a plane (or may be integral with each other). For example, a first portion of any one semiconductor pattern layer may correspond to the first pattern layer SCP1, and a second portion thereof may correspond to the second pattern layer P1.

A first insulation layer 10 may be disposed on the buffer layer BFL. The first insulation layer 10 may be an inorganic layer and/or an organic layer, and may have a single-layered or multi-layered structure.

In an embodiment, the first insulation layer 10 may not be formed on the entire surface of the display panel DP, and may not overlap a specific conductive pattern layer. For example, the first insulation layer 10 may overlap the channel region A1 of the first transistor T1, and at the same time, may expose at least a portion of each of the source region S1 and the drain region D1 of the first transistor T1. Accordingly, the source region S1 and the drain region D1 of the first transistor T1 which are exposed from the first insulation layer 10 may be reduced in a subsequent process, thereby functioning as a source and a drain. The source region S1 and the drain region D1 of the first transistor T1 may be relatively high in conductivity.

On the first insulation layer 10, a second semiconductor layer SCL2 may be disposed. The second semiconductor layer SCL2 may include semiconductor pattern layers. FIG. 4 illustrates two semiconductor pattern layers SCP2 and P2 as an example of the second semiconductor layer SCL2. A first pattern layer SCP2 of the second semiconductor layer SCL2 may include a source region S2, a channel region A2, and a drain region D2 of the second transistor T2. The source region S2 and the drain region D2 of the second transistor T2 functionally correspond to the source S2 and the drain D2 of the second transistor T2 described with reference to FIG. 2, and thus refer to the same reference numerals.

As illustrated in FIG. 4, a second pattern layer P2 of the second semiconductor layer SCL2 may not be reduced, thereby being relatively low in conductivity. In another example, the second pattern layer P2 of the second semiconductor layer SCL2 may be reduced, thereby being relatively high in conductivity. The conductivity of the second pattern layer P2 of the second semiconductor layer SCL2 may be determined according to whether a doping process is performed. The first pattern layer SCP2 and the second pattern layer P2 of the second semiconductor layer SCL2 may be a (2-1)th semiconductor pattern layer and a (2-2)th semiconductor pattern layer, respectively.

The second pattern layer P2 of the second semiconductor layer SCL2 may be a second electrode of the second capacitor C2. The second electrode of the second capacitor C2 may be the first electrode E2-1 of the hold capacitor Chold illustrated in FIG. 2.

In an embodiment, each of the first semiconductor layer SCL1 and the second semiconductor layer SCL2 may include an oxide semiconductor. Unlike a silicon semiconductor, the first semiconductor layer SCL1 and the second semiconductor layer SCL2, which are each an oxide semiconductor, may be laminated to overlap each other with an insulation layer interposed therebetween. Accordingly, a second capacitor C2 between the first semiconductor layer SCL1 and the second semiconductor layer SCL2 may be formed. For example, since the first insulation layer 10 is relatively thinner than the buffer layer BFL or than a third insulation layer 30 and a fourth insulation layer 40 which are to be described below, sufficient capacitance of the second capacitor C2 may be ensured. For example, the thickness of the first insulation layer 10 may be 1000 Å to 2000 Å. For example, the thickness of the first insulation layer 10 may be about 1400 Å, but embodiments are not limited thereto.

On the first insulation layer 10, a second insulation layer 20 may be disposed. The second insulation layer 20 may be an inorganic layer and/or an organic layer, and may have a single-layered structure or a multi-layered structure. The thickness of the second insulation layer 20 may be substantially the same as the thickness of the first insulation layer 10.

In an embodiment, the second insulation layer 20 may not be formed on the entire surface of the display panel DP, and may overlap only the specific conductive pattern layer to be described below. For example, the second insulation layer 20 may include insulation pattern layers. In FIG. 4, the second insulation layer 20 is illustrated as including a (2-1)th insulation pattern layer 20-1 and a (2-2)th insulation pattern layer 20-2. The (2-1)th insulation pattern layer 20-1 may overlap the channel region A1 of the first transistor T1. The (2-2)th insulation pattern layer 20-2 may overlap the channel region A2 of the second transistor T2. In an embodiment, the first insulation layer 10 may be disposed between the (2-1)th insulation pattern layer 20-1 and the channel region A1 of the first transistor T1. However, embodiments are not limited thereto, and the first insulation layer 10 disposed between the (2-1)th insulation pattern layer 20-1 and the channel region A1 of the first transistor T1 may be omitted. In this case, the (2-1)th insulation pattern layer 20-1 may be in contact with the channel region A1 of the first transistor T1.

The source region S2 and the drain region D2 of the second transistor T2 which are exposed from the second insulation layer 20 may be reduced in a subsequent process, thereby functioning as a source and a drain of the second transistor T2. The source region S2 and the drain region D2 of the second transistor T2 may be relatively high in conductivity.

On the second insulation layer 20, a second conductive layer MP2 may be disposed. The second conductive layer MP2 may include conductive pattern layers. FIG. 4 illustrates the first upper gate G1-1 of the first transistor T1 and the second upper gate G2-1 of the second transistor T2 as an example of the second conductive layer MP2. The first upper gate G1-1 of the first transistor T1 and the second upper gate G2-1 of the second transistor T2 may be the (2-1)th conductive pattern layer and the (2-2)th conductive pattern layer, respectively.

The first upper gate G1-1 of the first transistor T1 and the second upper gate G2-1 of the second transistor T2 may overlap the channel region A1 of the first transistor T1 and the channel region A2 of the second transistor T2, respectively.

On the second insulation layer 20, the third insulation layer 30 which covers the second conductive layer MP2 may be disposed. In an embodiment, the third insulation layer 30 may be an organic layer, and may have a single-layered structure, but embodiments are not limited thereto. In an embodiment, the thickness of the third insulation layer 30 may be greater than the thickness of the first insulation layer 10. For example, the thickness of the third insulation layer 30 may be 3000 Å to 7000 Å. For example, the thickness of the third insulation layer 30 may be about 5000 Å, but embodiments are not limited thereto.

The third insulation layer 30 may cover the source regions S1 and S2 and the drain regions D1 and D2 of the respective first and second transistors T1 and T2. During a process of forming the third insulation layer 30, hydrogen may be injected into the source regions S1 and S2 and the drain regions D1 and D2 of the respective first and second transistors T1 and T2, so that the source regions S1 and S2 and the drain regions D1 and D2 may be reduced. Since the first and second upper gates G1-1 and G2-1 function as masks to block the injection of the hydrogen, the channel regions A1 and A2 of the respective first and second transistors T1 and T2 may not be reduced.

On the third insulation layer 30, a third conductive layer MP3 may be disposed. The third conductive layer MP3 may include conductive pattern layers. FIG. 4 illustrates first to ninth connection electrodes CNE1 and CNE9 as an example of the third conductive layer MP3. In FIG. 4, the third connection electrode CNE3 and the fifth connection electrode CNE5 may be connected to each other on a plane. For example, the third connection electrode CNE3 and the fifth connection electrode CNE5 may be electrically connected. In this regard, the connection is indicated as "Syn". In the following drawings, the "Syn" may be understood as an "electrical connection."

An anode electrode AE to be described below may be electrically connected to the second pattern layer P1 of the first semiconductor layer SCL1 though the third connection electrode CNE3, and may be electrically connected to the source region S1 and the first upper gate G1-1 of the first transistor T1 through the fifth connection electrode CNE5.

On the third insulation layer 30, the fourth insulation layer 40 which covers the third conductive layer MP3 may be disposed. In an embodiment, the fourth insulation layer 40 may be an organic layer, and may have a single-layered structure, but embodiments are not limited thereto.

In an embodiment, the display element layer DP-OLED may be disposed on the fourth insulation layer 40. The display element layer DP-OLED may include the light emitting diode OLED, a pixel definition film PDL, and the thin film encapsulation layer TFE.

The anode electrode AE of light emitting diode OLED may be disposed on the fourth insulation layer 40. The anode electrode AE may be connected to the third connection electrode CNE3 by passing through the fourth insulation layer 40. On the fourth insulation layer 40, the pixel definition film PDL may be disposed.

In an embodiment, the light emitting diode OLED may include the anode electrode AE, a hole control layer HCL, a light emitting layer EML, an electron control layer ECL, and a cathode electrode CE.

The pixel definition film PDL may expose at least a portion of the anode electrode AE, thereby defining a light emitting region PXA. A non-light emitting region NPXA may surround the light emitting region PXA on a plane.

The hole control layer HCL may be commonly disposed in the light emitting region PXA and in the non-light emitting region NPXA. The hole control layer HCL may include a hole transport layer and a hole injection layer.

On the hole control layer HCL, the light emitting layer EML may be disposed. The light emitting layer EML may be disposed only on the anode electrode AE exposed by the pixel definition film PDL. The light emitting layer EML may be formed separately for each light emitting region PXA. In an embodiment, a patterned light emitting layer EML is illustrated, but the light emitting layer EML may be commonly disposed in the light emitting region PXA and in the non-light emitting region NPXA. The commonly disposed light emitting layer EML may generate white light or blue light. For example, the light emitting layer EML may have a multi-layered structure.

On the light emitting layer EML, the electron control layer ECL may be disposed. In an embodiment, the electron control layer ECL may include an electron transport layer and an electron injection layer. On the electron control layer ECL, the cathode electrode CE may be disposed. Each of the electron control layer ECL and the cathode electrode CE may be commonly disposed in the light emitting region PXA and in the non-light emitting region NPXA.

On the cathode electrode CE, the thin film encapsulation layer TFE may be disposed. The thin film encapsulation layer TFE may be commonly disposed in the light emitting region PXA and in the non-light emitting region NPXA. In an embodiment, the thin film encapsulation layer TFE may cover (e.g., directly cover) the cathode electrode CE. In an embodiment, a capping layer which directly covers the cathode electrode CE may be further disposed. In an embodiment, a laminate structure of the light emitting diode OLED may have a structure inverted from the structure illustrated in FIG. 4.

The thin film encapsulation layer TFE may include at least an inorganic layer or an organic layer. In an embodiment, the thin film encapsulation layer TFE may include two inorganic layers and an organic layer disposed between the two inorganic layers. In an embodiment, the thin film encapsulation layer TFE may include inorganic layers and organic layers which are alternately laminated.

Figure 5:
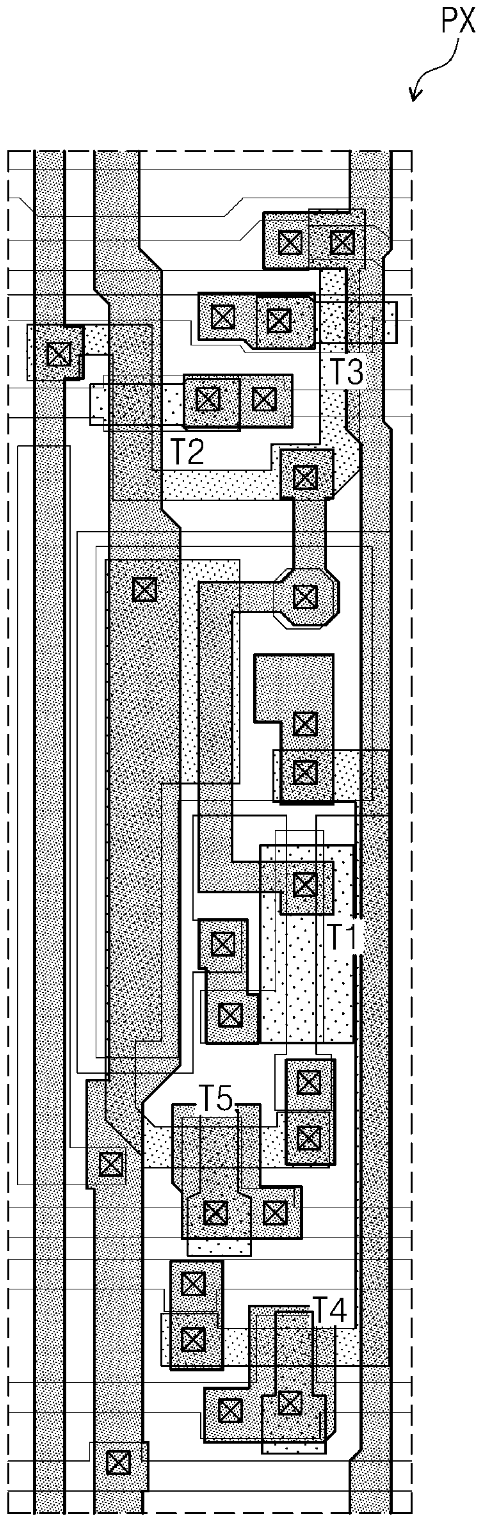
FIG. 5 is a schematic plan view of a pixel according to an embodiment.

FIG. 5 is a schematic plan view of a pixel PX according to an embodiment. FIG. 6A to FIG. 6F are schematic plan views according to a lamination order of pattern layers included in a pixel PX according to an embodiment.

FIG. 5 and FIG. 6A to FIG. 6F show a layout of a pixel PX which implements the equivalent circuit of FIG. 2. FIG. 5 and FIG. 6A to FIG. 6F show embodiments of a pixel PX capable of implementing the display panel DP of FIG. 4, and the embodiment of the display panel DP illustrated in FIG. 4 is not limited to the embodiments illustrated in FIG. 5 and FIG. 6A to FIG. 6F. FIG. 6A to FIG. 6F may be schematic plan views according to the lamination order of patterns included in the pixel PX illustrated in FIG. 5. Hereinafter, detailed descriptions of the same compositions as those described with reference to FIG. 1 to FIG. 4 will be omitted for descriptive convenience.

FIG. 5 illustrates a schematic plan view of a pixel PX disposed in a row. The pixel PX may include conductive pattern layers disposed on a side and/or another side of a pixel row, or disposed at regular intervals (or distances) with pixels in the pixel row interposed therebetween.

Figure 6A:
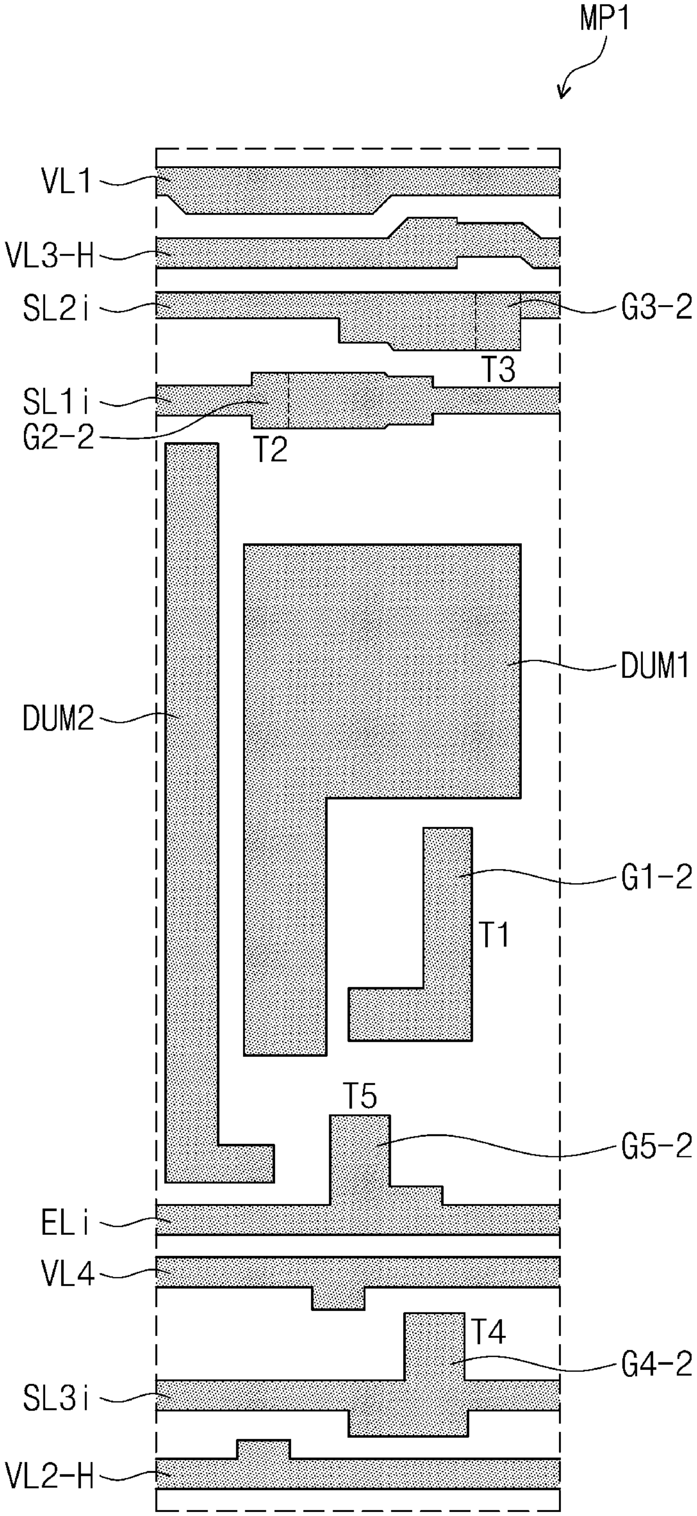
FIGS. 6A, 6B, 6C, 6D, 6E, and 6F are schematic plan views according to a lamination order of patterns included in a pixel according to an embodiment.

Referring to FIG. 5 and FIG. 6A, the conductive pattern layers of the first conductive layer MP1 may be disposed on the base layer BS (see FIG. 4). A conductive pattern layer of the first conductive layer MP1 may include the first voltage line VL1, a second horizontal voltage line VL2-H, a third horizontal voltage line VL3-H, the fourth voltage line VL4, the i-th scan line SL1*i* of the first group, the i-th scan line SL2*i* of the second group, the i-th scan line SL3*i* of the third group, a first dummy pattern layer DUM1, and a second dummy pattern layer DUM2.

The second horizontal voltage line VL2-H and the third horizontal voltage line VL3-H may be horizontal dummy pattern layers respectively forming the second voltage line VL2 (see FIG. 2) and the third voltage line VL3 (see FIG. 2). A second vertical voltage line VL2-V and a third vertical voltage line VL3-V to be described below with reference to FIG. 6F may be vertical dummy pattern layers respectively forming the second voltage line VL2 (see FIG. 2) and the third voltage line VL3 (see FIG. 2). The second horizontal voltage line VL2-H and the third horizontal voltage line VL3-H may be respectively and electrically connected to the second vertical voltage line VL2-V and the third vertical voltage line VL3-V, which will be described below with reference to FIG. 6F.

As described above with reference to FIG. 2, the first voltage line VL1 may receive the first power voltage ELVSS, the second voltage line VL2 may receive the second power voltage ELVDD, the third voltage line VL3 may receive the first voltage Vref, and the fourth voltage line VL4 may receive the second voltage Vint.

The i-th scan line SL1*i* of the first group, the i-th scan line SL2*i* of the second group, the i-th scan line SL3*i* of the third group, and the i-th light emission signal line ELi receive signals Ei, GRi, GWi, and Gli as corresponding to those in FIG. 2.

The conductive pattern layer of the first conductive layer MP1 may further include the first, second, third, fourth, and fifth lower gates G1-2, G2-2, G3-2, G4-2, and G5-2 of the first to fifth transistors T1, T2, T3, T4, and T5.

The second, third, fourth, and fifth lower gates G2-2, G3-2, G4-2, and G5-2 of the second to fifth transistors T2, T3, T4, and T5 may be respectively connected to the i-th scan line SL1*i* of the first group, the i-th scan line SL2*i* of the second group, the i-th scan line SL3*i* of the third group, and the i-th light emission signal line ELi. The first dummy pattern layer DUM1 and the first lower gate G1-2 of the first transistor T1 are illustrated as being spaced apart from each other in FIG. 6A, but embodiments are not limited thereto, and the first dummy pattern layer DUM1 and the first lower gate G1-2 of the first transistor T1 may have a shape of a single body (or may be integral with each other). The first dummy pattern layer DUM1 may be the first electrode E1-1 of the storage capacitor Cst described above with reference to FIG. 2. The second dummy pattern layer DUM2 may function as a blocking electrode.

Figure 6B:
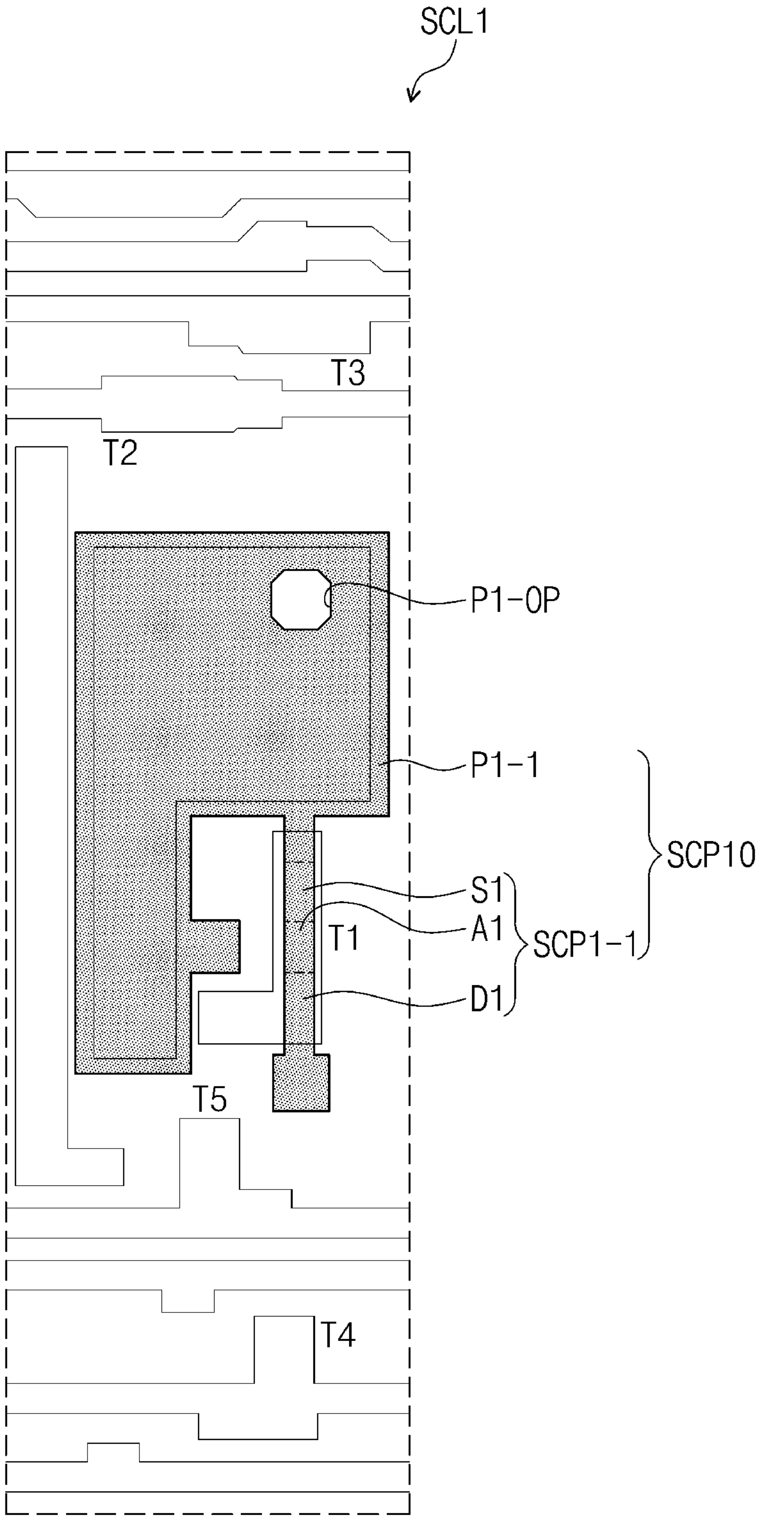

Referring to FIG. 5 and FIG. 6B, the first semiconductor layer SCL1 may be disposed on the buffer layer BFL (see FIG. 4). The first semiconductor layer SCL1 may include an oxide semiconductor.

The first semiconductor layer SCL1 may include a first semiconductor pattern layer SCP10. The first semiconductor pattern layer SCP10 may include a first portion SCP1-1 and a second portion P1-1. The first portion SCP1-1 may include the source region S1, the channel region A1, and the drain region D1 of the first transistor T1. In the step illustrated in FIG. 6B, the source region/the drain region/the channel region may not be distinguished from each other in the first portion SCP1-1. After a reduction process is performed by using the first upper gate G1-1 to be described with reference to FIG. 6D as a mask, the source region/the drain region/the channel region may be distinguished from each other.

The first portion SCP1-1 and the second portion P1-1 may have a shape of a single body (or may be integral with each other). The first portion SCP1-1 and the second portion P1-1 may respectively correspond to the first pattern layer SCP1 and the second pattern layer P1-1 of FIG. 4. In the second portion P1-1, an opening P1-OP may be defined. The second portion P1-1 may be the second electrode E1-2 of the storage capacitor Cst described above with reference to FIG. 2.

Figure 6C:
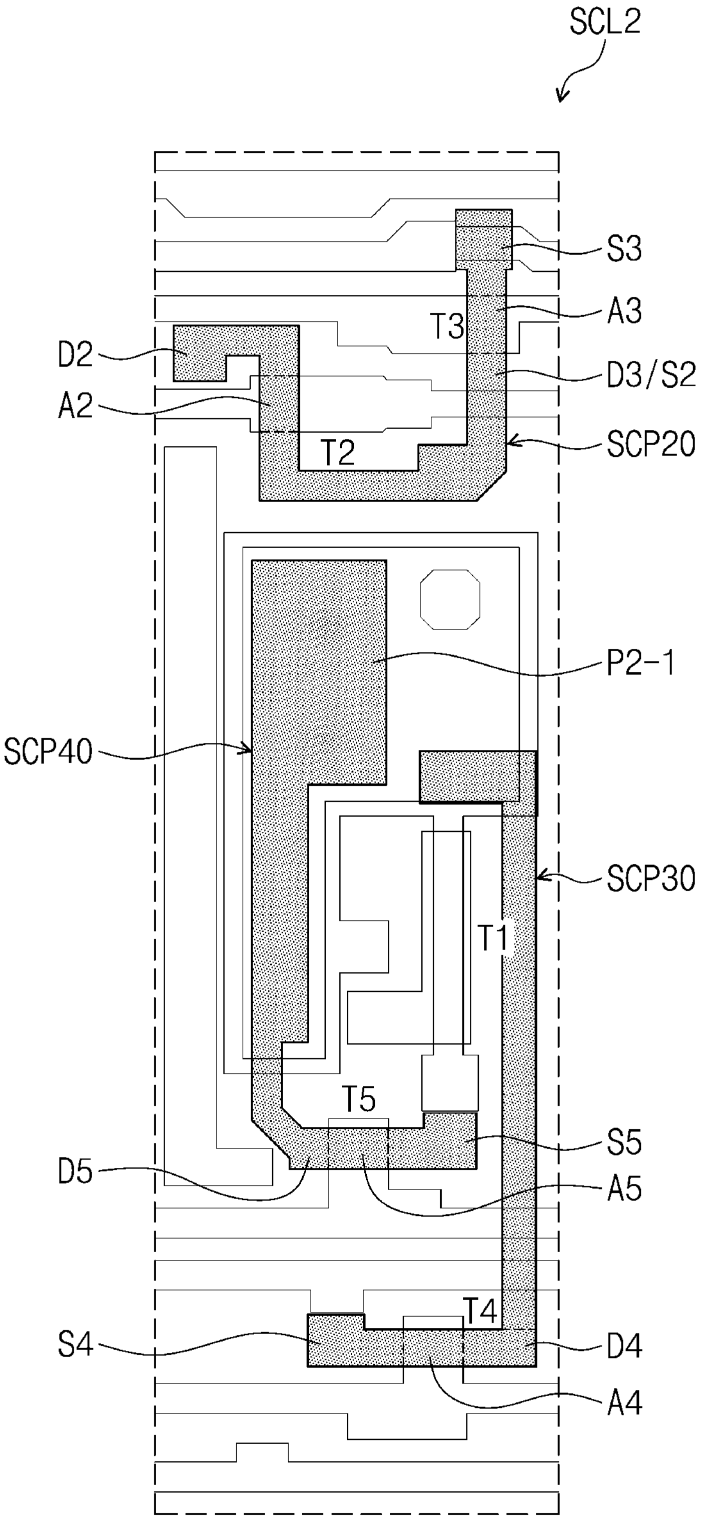

Referring to FIG. 5 and FIG. 6C, the second semiconductor layer SCL2 may be disposed on the first insulation layer 10 (see FIG. 4). The second semiconductor layer SCL2 may include an oxide semiconductor.

The second semiconductor layer SCL2 may include a second semiconductor pattern layer SCP20, a third semiconductor pattern layer SCP30, and a fourth semiconductor pattern layer SCP40. The second semiconductor pattern layer SCP20 may include the source regions S2 and S3, channel regions A2 and A3, and the drain regions D2 and D3 of the respective second and third transistors T2 and T3. The third semiconductor pattern layer SCP30 may include the source region S4, a channel region A4, and the drain region D4 of the fourth transistor T4. The fourth semiconductor pattern layer SCP40 may include the source region S5, a channel region A5, and the drain region D5 of the fifth transistor T5. The fourth semiconductor pattern layer SCP40 may include a portion P2-1 corresponding to the second pattern layer P2 illustrated in FIG. 4.

Figure 6D:
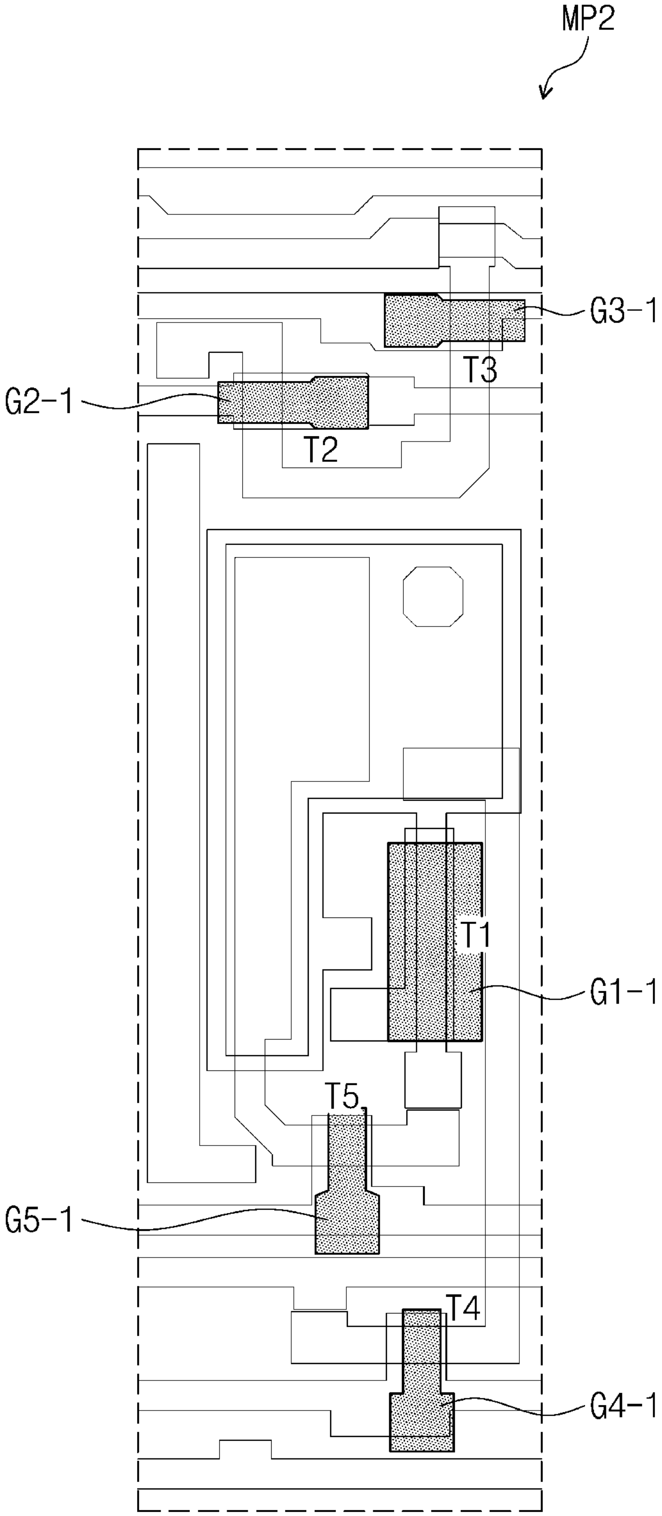

In the step illustrated in FIG. 6C, the source region/the drain region/the channel region may not be distinguished from each other in each of the second to fourth semiconductor pattern layers SCP20, SCP30, and SCP40. After a reduction process is performed by using the first, second, third, fourth, and fifth upper gates G2-1, G3-1, G4-1, and G5-1 to be described with reference to FIG. 6D as masks, the source regions/the drain regions/the channel regions may be distinguished from each other. Referring to FIG. 5 and FIG. 6D, the second conductive layer MP2 may be disposed on the second insulation layer 20 (see FIG. 4). Conductive pattern layers of the second conductive layer MP2 may include the first, second, third, fourth, and fifth upper gates G1-1, G2-1, G3-1, G4-1, and G5-1 of the first, second, third, fourth, and fifth transistors T1 to T5. In case that a reduction process is performed by using the first, second, third, fourth, and fifth upper gates G1-1, G2-1, G3-1, G4-1, and G5-1 as masks, the source region/the drain region of each of the first to fourth semiconductor pattern layers SCP10, SCP20, SCP30, and SCP40 (see FIG. 6B and FIG. 6C) may be higher in conductivity than the channel region. Through the reduction process, the first, second, third, fourth, and fifth transistors T1 to T5 which have a switch function may be completed.

Figure 6E:
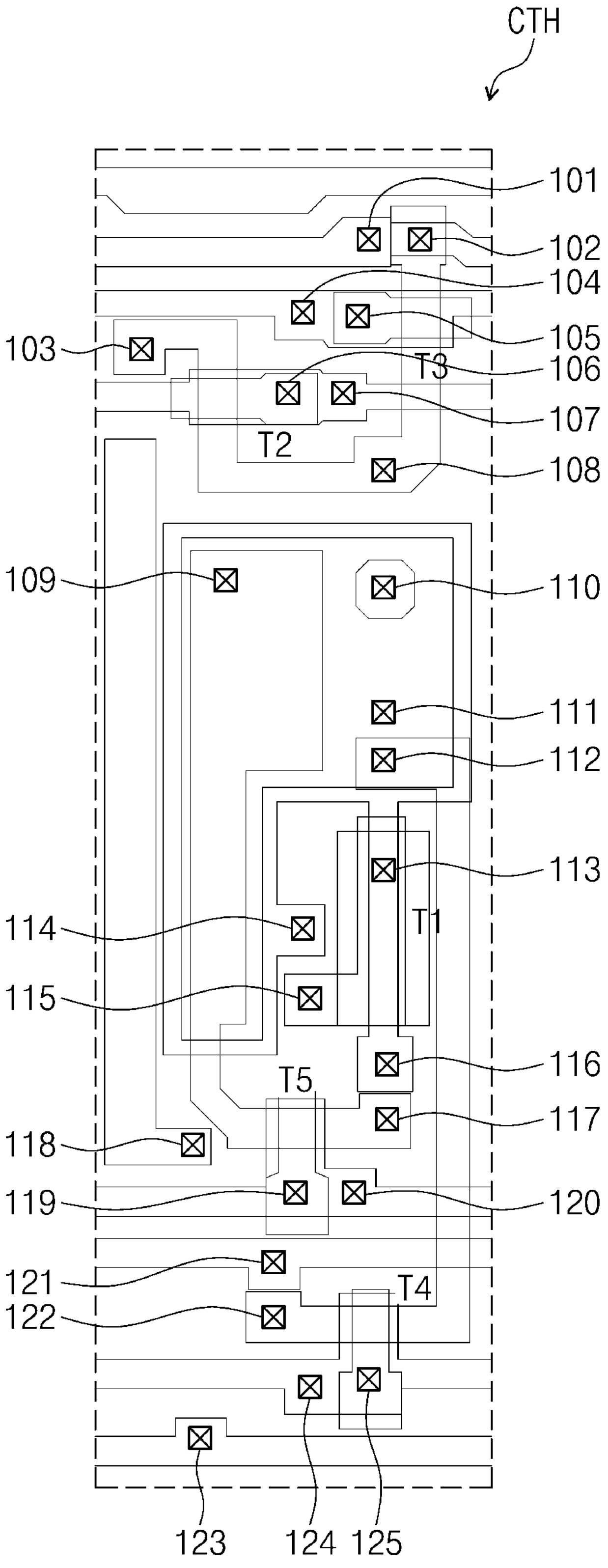

Referring to FIG. 5 and FIG. 6E, the third insulation layer 30 (see FIG. 4) may be disposed on the second insulation layer 20 (see FIG. 4). FIG. 6E illustrates contact-holes CTH (e.g., 101 to 125) defined on the third insulation layer 30. Some of the contact-holes 101 to 125 may further pass through at least some of the buffer layer BFL, the first insulation layer 10, and the second insulation layer 20, and others thereof may pass through only the third insulation layer 30. The conductive pattern layers and the semiconductor pattern layers described with reference to FIG. 6A to FIG. 6D and conductive pattern layers illustrated in FIG. 6F, which will be described below, may be electrically connected to each other via the contact-holes 101 to 125 so as to form the equivalent circuit of FIG. 2.

Figure 6F:
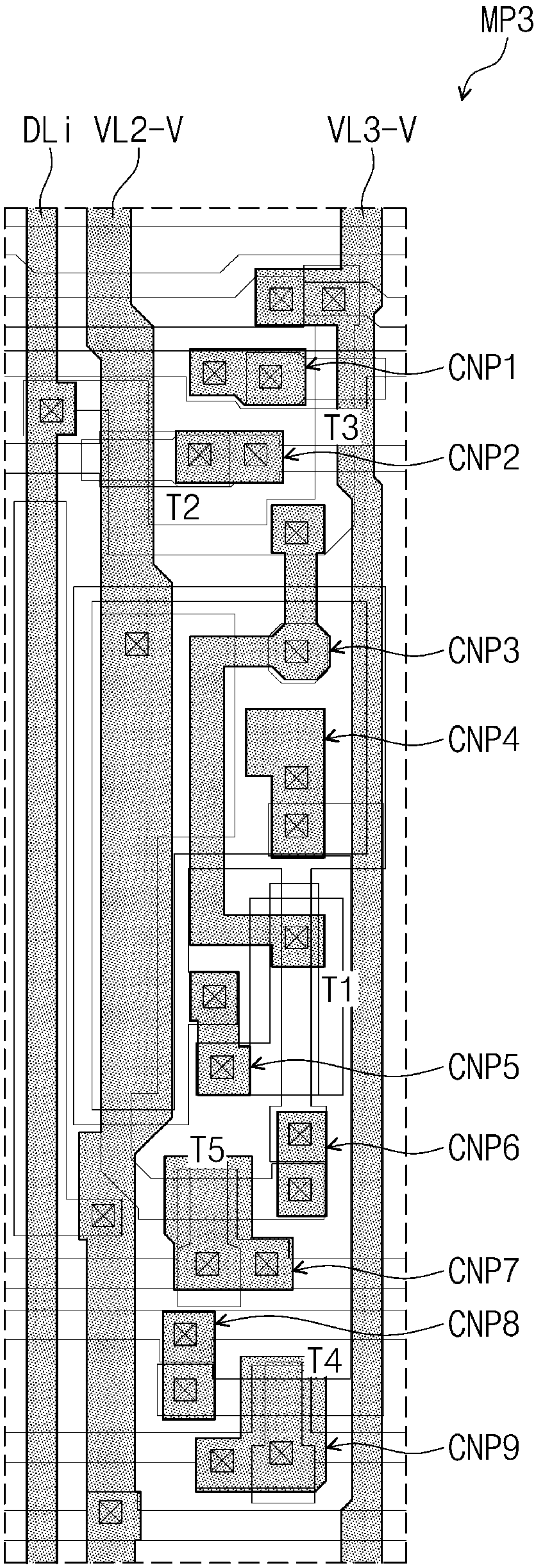

Referring to FIG. 5, FIG. 6E, and FIG. 6F, the third conductive layer MP3 may be disposed on the third insulation layer 30 (see FIG. 4). Conductive pattern layers of the third conductive layer MP3 include the second vertical voltage line VL2-V, the third vertical voltage line VL3-V, and the j-th data line DLj. The j-th data line DLj may be connected to the drain region D2 of the second transistor T2 via the contact-hole 103. The second vertical voltage line VL2-V may be connected to the drain region D5 of the second transistor T5 via the contact-hole 109. For example, the second vertical voltage line VL2-V may be connected to the second horizontal voltage line VL2-H described above with reference to FIG. 6A via the contact-hole 123. For example, the second vertical voltage line VL2-V may be connected to the second dummy pattern layer DUM2 described above with reference to FIG. 6A via the contact-hole 118. The third vertical voltage line VL3-V may connect the third horizontal voltage line VL3-H described above with reference to FIG. 6A and the source region S3 of the third transistor T3 via the contact-holes 101 and 102.

The conductive pattern layers of the third conductive layer MP3 may further include first to ninth connection pattern layers CNP1 to CNP9. Referring to FIG. 6A and FIG. 6F together, the first connection pattern layer CNP1 may connect the i-th scan line SL2*i* of the second group and the third upper gate G3-1 of the third transistor T3 via the contact-holes 104 and 105. The second connection pattern layer CNP2 may connect the i-th scan line SL2*i* of the second group and the third upper gate G3-1 of the third transistor T3 via the contact-holes 106 and 107. The second connection pattern layer CNP2 may connect the i-th scan line SL2*i* of the second group and the third upper gate G3-1 of the third transistor T3 via the contact-holes 106 and 107. The third connection pattern layer CNP3 may connect the first upper gate G1-1 of the first transistor T1, the second portion P1-1 (see FIG. 6B) of the first semiconductor pattern layer SCP10, and the source region S2 of the second transistor T2 via the contact-holes 108, 110, and 113. The fourth connection pattern layer CNP4 may connect the source region S1 of the first transistor T1 and the drain region D4 of the fourth transistor T4 via the contact-holes 111 and 112. The fifth connection pattern layer CNP5 may connect the second portion P1-1 of the first semiconductor pattern layer SCP10 and the first lower gate G1-2 of the first transistor T1 via the contact-holes 114 and 115. The sixth connection pattern layer CNP6 may connect drain region D1 of the first transistor T1 and the source region S5 of the fifth transistor T5 via the contact-holes 116 and 117. The seventh connection pattern layer CNP7 may connect the i-th light emission signal line ELi and the fifth lower gate G5-2 of the fifth transistor T5 via the contact-holes 119 and 120. The eighth connection pattern layer CNP8 may connect the fourth voltage line VL4 voltage and the source region S4 of the fourth transistor T4 via the contact-holes 121 and 122. The ninth connection pattern layer CNP9 may connect the i-th scan line SL3*i* of the third group and the fourth upper gate G4-1 of the fourth transistor T4 via the contact-holes 124 and 125.

Figure 7:
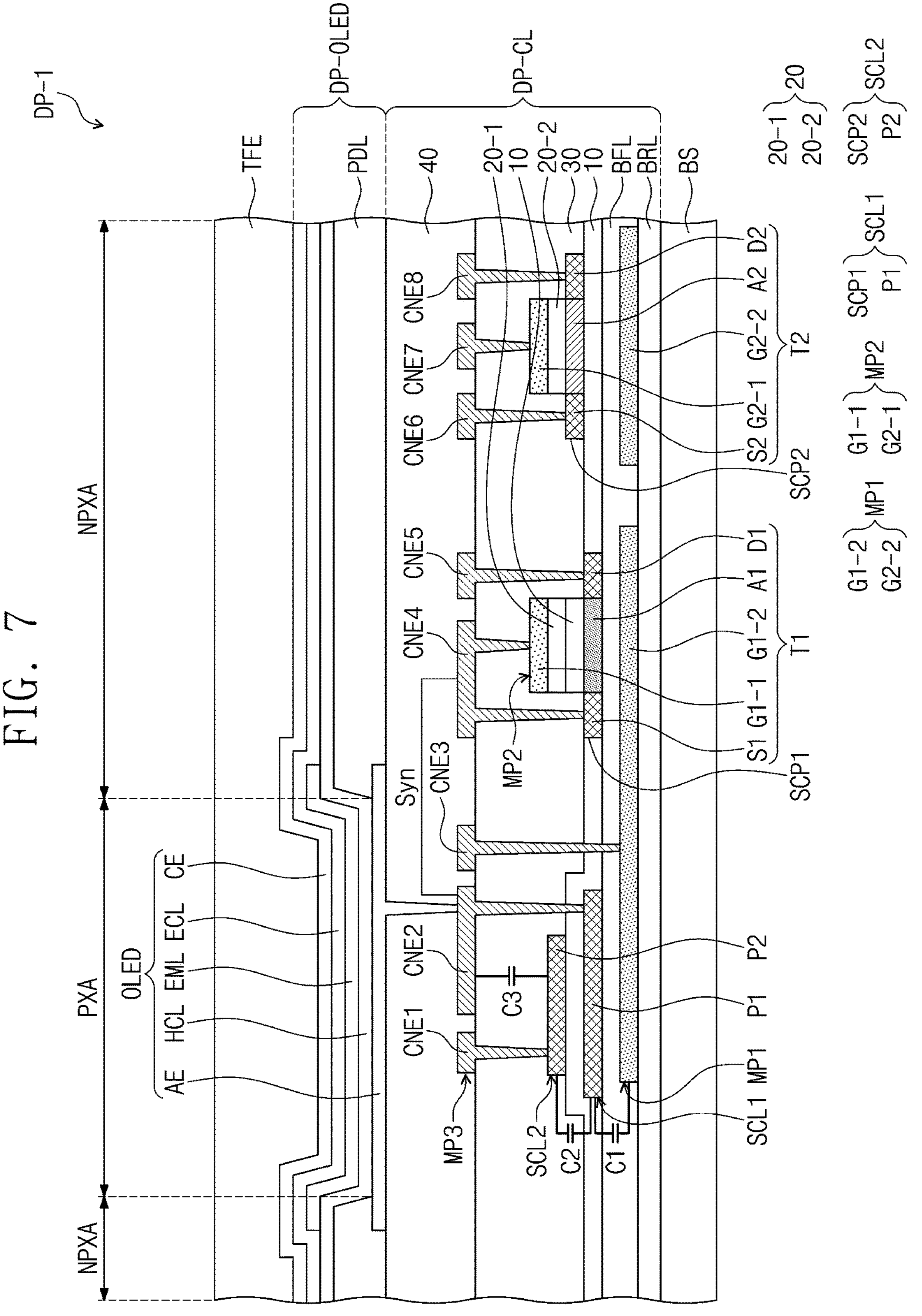
FIG. 7 is a schematic cross-sectional view of a display panel according to an embodiment.

FIG. 7 is a schematic cross-sectional view of a display panel DP-1 according to an embodiment. FIG. 7 illustrates a cross-section corresponding to FIG. 4. Hereinafter, detailed descriptions of the same compositions as those described with reference to FIG. 1 to FIG. 6F will be omitted for descriptive convenience.

The display panel DP-1 of FIG. 7 may further include a third capacitor C3 compared to the display panel DP of FIG. 4. For example, the third capacitor C3 may be formed between the second connection electrode CNE2 and the second pattern layer P2 of the second semiconductor layer SCL2. The first connection electrode CNE1 may be connected to the second pattern layer P2 of the second semiconductor layer SCL2 so as to provide the second power voltage ELVDD to the second pattern layer P2 of the second semiconductor layer SCL2.

The second pattern layer P2 of the second semiconductor layer SCL2 may be the second electrode of the second capacitor C2, and at the same time, may be a second electrode of the third capacitor C3. The second connection electrode CNE2 may be a first electrode of the third capacitor C3. The third capacitor C3 and the second capacitor C2 may be connected in parallel, thereby forming the hold capacitor Chold (see FIG. 2). Accordingly, the display panel DP-1 may increase capacitance of the hold capacitor Chold (see FIG. 2).

Figure 8:
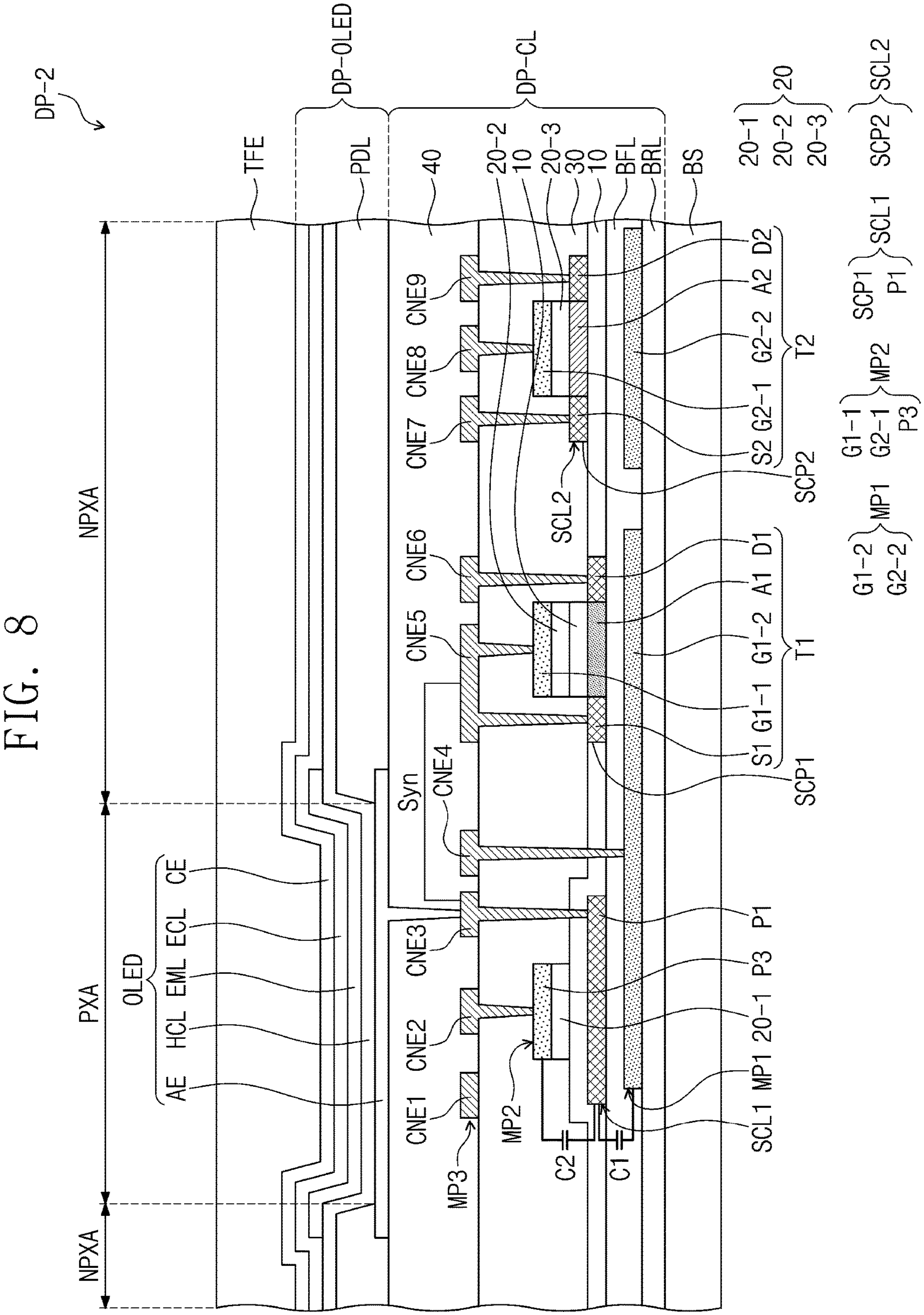
FIG. 8 is a schematic cross-sectional view of a display panel according to an embodiment.
Figure 9:
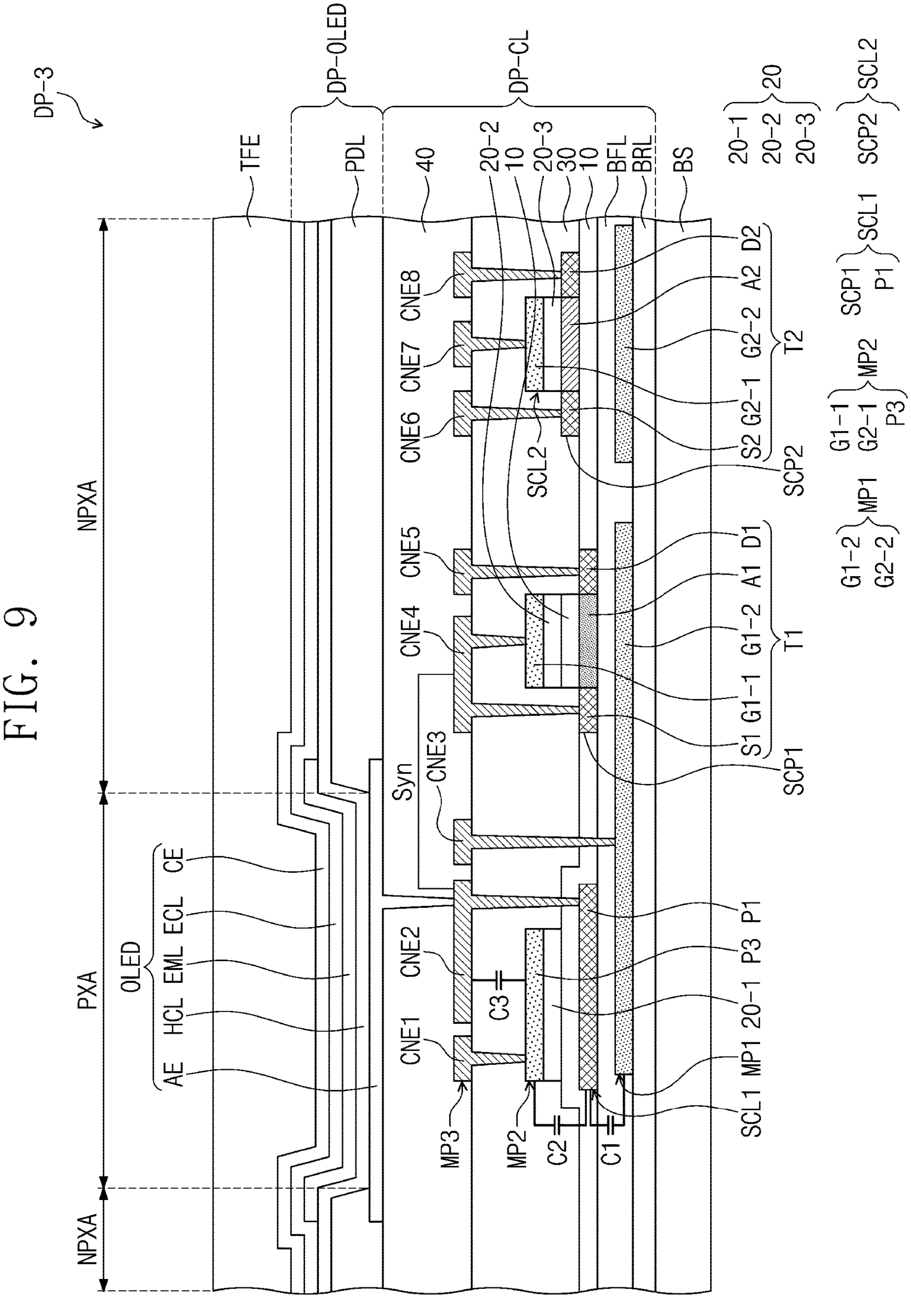
FIG. 9 is a schematic cross-sectional view of a display panel according to an embodiment.

FIG. 8 and FIG. 9 are respectively schematic cross-sectional views of display panels DP-2 and DP-3 according to an embodiment. FIG. 8 and FIG. 9 each illustrate a cross-section corresponding to FIG. 4. Hereinafter, detailed descriptions of the same compositions as those described with reference to FIG. 1 to FIG. 7 will be omitted for descriptive convenience.

Referring to FIG. 8, the display panel DP-2 of an embodiment may include a base layer BS, a circuit element layer DP-CL, a display element layer DP-OLED, and a thin film encapsulation layer TFE. The circuit element layer DP-CL may include a barrier layer BRL, a buffer layer BFL, first to fourth insulation layers 10, 20, 30, and 40, a first conductive layer MP1, a first semiconductor layer SCL1, a second semiconductor layer SCL2, a second conductive layer MP2, and a third conductive layer MP3.

The first conductive layer MP1 may be disposed on the barrier layer BRL. The first conductive layer MP1 may include conductive pattern layers. FIG. 8 illustrates a first lower gate G1-2 and a second lower gate G2-2 as an example of conductive pattern layers of the first conductive layer MP1. The first lower gate G1-2 may be a (1-1)th conductive pattern layer, and the second lower gate G2-2 may be a (1-2)th conductive pattern layer.

The first semiconductor layer SCL1 may be disposed on the buffer layer BFL. The first semiconductor layer SCL1 may include semiconductor pattern layers. FIG. 8 illustrates a first pattern layer SCP1 and a second pattern layer P1 as an example of the first semiconductor layer SCL1. The first pattern layer SCP1 and the second pattern layer P1 of the first semiconductor layer SCL1 may be as a (1-1)th semiconductor pattern layer and a (1-2)th semiconductor pattern layer, respectively.

The second pattern layer P1 of the first semiconductor layer SCL1 may overlap the first lower gate G1-2. The first lower gate G1-2 and the second pattern layer P1 of the first semiconductor layer SCL1, which overlap each other, may form a first capacitor C1. The first lower gate G1-2 may be a first electrode of the first capacitor C1, and the second pattern layer P1 of the first semiconductor layer SCL1 may be a second electrode of the first capacitor C1. Referring to FIG. 2 together, the first lower gate G1-2 may be the first electrode E1-1 of the storage capacitor Cst, and the second pattern layer P1 of the first semiconductor layer SCL1 may be the second electrode E1-2 of the storage capacitor Cst.

For example, the second pattern layer P1 of the first semiconductor layer SCL1 may be a first electrode of a second capacitor C2. Referring to FIG. 2 together, the second pattern layer P1 of the first semiconductor layer SCL1 may be the second electrode E2-2 of the hold capacitor Chold.

The first insulation layer 10 may be disposed on the buffer layer BFL. In an embodiment, the first insulation layer 10 may not be formed on the entire surface of the display panel DP-2, and may not overlap a specific conductive pattern layer. For example, the first insulation layer 10 may overlap a channel region A1 of a first transistor T1, and at the same time, may expose at least a portion of each of a source region S1 and a drain region D1 of the first transistor T1.

On the first insulation layer 10, the second semiconductor layer SCL2 may be disposed. The first semiconductor layer SCL1 may include one or more semiconductor pattern layers. FIG. 8 illustrates a first pattern layer SCP2 as an example of the second semiconductor layer SCL2. The first pattern layer SCP2 may include a source region S2, a channel region A2, and a drain region D2 of a second transistor T2.

On the first insulation layer 10, the second insulation layer 20 may be disposed. In an embodiment, the second insulation layer 20 may not be formed on the entire surface of the display panel DP-2, and may overlap only the specific conductive pattern layer to be described below. For example, the second insulation layer 20 may include insulation pattern layers. In FIG. 8, the second insulation layer 20 is illustrated as including a (2-1)th insulation pattern 20-1, a (2-2)th insulation pattern 20-2, and a (2-3)th insulation pattern 20-3. The (2-1)th insulation pattern layer 20-1 may overlap the second pattern layer P1 of the first semiconductor layer SCL1. The (2-2)th insulation pattern layer 20-2 may overlap the channel region A1 of the first transistor T1. The (2-3)th insulation pattern layer 20-3 may overlap the channel region A2 of the second transistor T2. In an embodiment, the first insulation layer 10 disposed between the (2-2)th insulation pattern layer 20-2 and the channel region A1 of the first transistor T1 may be omitted. In this case, the (2-2)th insulation pattern layer 20-2 may be in contact with the channel region A1 of the first transistor T1.

On the second insulation layer 20, the second conductive layer MP2 may be disposed. The second conductive layer MP2 may include conductive pattern layers. FIG. 8 illustrates an electrode pattern layer P3, a first upper gate G1-1 of the first transistor T1, and a second upper gate G2-1 of the second transistor T2 as an example of the second conductive layer MP2. The first upper gate G1-1 of the first transistor T1, the second upper gate G2-1 of the second transistor T2, and the electrode pattern layer P3 may respectively be a (2-1)th conductive pattern layer, a (2-2)th conductive pattern layer, and a (2-3)th conductive pattern layer.

The electrode pattern layer P3 may overlap the second pattern layer P1 of the first semiconductor layer SCL1. The electrode pattern layer P3 and the second pattern layer P1 of the first semiconductor layer SCL1, which overlap each other, may form the second capacitor C2. The second pattern layer P1 of the first semiconductor layer SCL1 may be the first electrode of the second capacitor C2, and the electrode pattern layer P3 may be a second electrode of the second capacitor C2. Referring to FIG. 2 together, the second pattern layer P1 of the first semiconductor layer SCL1 may be the second electrode E2-2 of the hold capacitor Chold, and may be the first electrode E2-1 of the hold capacitor Chold.

On the second conductive layer MP2, the third insulation layer 30 may be disposed. On the second conductive layer MP2, the third conductive layer MP3 may be disposed. The third conductive layer MP3 may include conductive pattern layers. FIG. 8 illustrates first to ninth connection electrodes CNE1 and CNE9 as an example of the third conductive layer MP3. The third connection electrode CNE3 and the fifth connection electrode CNE5 may be electrically connected to each other. An anode electrode AE to be described below may be electrically connected to the second pattern layer P1 of the first semiconductor layer SCL1 though the third connection electrode CNE3, and may be electrically connected to the source region S1 and the first upper gate G1-1 of the first transistor T1 through the fifth connection electrode CNE5.

On the third insulation layer 30, the fourth insulation layer 40 which covers the third conductive layer MP3 may be disposed. In an embodiment, the fourth insulation layer 40 may be an organic layer, and may have a single-layered structure, but embodiments are not limited thereto.

On the fourth insulation layer 40, the display element layer DP-OLED may be disposed. The description of the display element layer DP-OLED may be the same as that described above with reference to FIG. 4.

The display panel DP-2 according to an embodiment may include the first capacitor C1 formed between the first lower gate G1-2 and a second pattern layer P1 of the first semiconductor layer SCL1, and the second capacitor C2 formed between the second pattern layer P1 of the first semiconductor layer SCL1 and the electrode pattern layer P3. The first capacitor C1 may correspond to the storage capacitor Cst (see FIG. 2), and the second capacitor C2 may correspond to the hold capacitor Chold (see FIG. 2). In an embodiment, the second pattern layer P1 of the first semiconductor layer SCL1 may include an oxide semiconductor, and the electrode pattern layer P3 may include a metal material. Accordingly, the display panel DP-2 may ensure sufficient capacitance of the second capacitor C2.

The display panel DP-3 of FIG. 9 may further include a third capacitor C3 compared to the display panel DP-2 of FIG. 8. For example, the third capacitor C3 may be formed between the second connection electrode CNE2 and the electrode pattern layer P3. The first connection electrode CNE1 may be connected to the electrode pattern layer P3 so as to provide the second power voltage ELVDD to the electrode pattern layer P3.

The electrode pattern layer P3 may be the second electrode of the second capacitor C2, and at the same time, may be a second electrode of the third capacitor C3. The second connection electrode CNE2 may be a first electrode of the third capacitor C3. The third capacitor C3 and the second capacitor C2 may be connected in parallel, thereby forming the hold capacitor Chold (see FIG. 2). Accordingly, the display panel DP-3 may increase capacitance of the hold capacitor Chold (see FIG. 2).

A display device may form a capacitor by laminating a conductive layer including an oxide semiconductor in multiple layers. An insulation layer may be disposed between the conductive layers each including an oxide semiconductor, and the insulation layer may be relatively thinner than other insulation layers including the display device. Accordingly, sufficient capacitance between the conductive layers each including an oxide semiconductor may be implemented, and the display quality of the display device may be improved or enhanced.

In a display device of an embodiment, conductive layers each including an oxide semiconductor are laminated in multiple layers with an insulation layer interposed therebetween, thereby forming a capacitor. The insulation layer may relatively be less thick than other insulation layers. Accordingly, sufficient capacitance between the conductive layers laminated in multiple layers may be implemented, and the display quality of the display device may be improved and enhanced.

Although the invention has been described with reference to embodiments of the invention, it will be understood by those skilled in the art that various modifications and changes in form and details may be made therein without departing from the spirit and scope of the invention as set forth in the following claims.

Accordingly, the technical scope of the invention is not intended to be limited to the contents set forth in the detailed description of the specification, but is intended to be defined by the appended claims.

What is claimed is:

1. A display device comprising:

a base layer;

a first conductive layer disposed on the base layer;

an inorganic layer disposed on the first conductive layer;

a first semiconductor layer disposed on the inorganic layer and including an oxide semiconductor, the first semiconductor layer comprises a (1-1)th semiconductor pattern layer including a source region, a drain region and a channel region;

a first insulation layer disposed on the first semiconductor layer, wherein the first insulation layer exposes entireties of upper surfaces of the drain region and the source region of the (1-1)th semiconductor pattern layer; and a second semiconductor layer including an oxide semiconductor and disposed on the first insulation layer, wherein:

the first conductive layer is a first electrode of a first capacitor;

the first semiconductor layer is a second electrode of the first capacitor and a first electrode of a second capacitor; and the second semiconductor layer is a second electrode of the second capacitor.

2. The display device of claim 1, wherein:

the first conductive layer comprises a (1-1)th conductive pattern layer and a (1-2)th conductive pattern layer which are spaced apart from each other in a plan view;

the first semiconductor layer further comprises a (1-2)th semiconductor pattern layer which is spaced apart from the (1-1)th semiconductor pattern layer in a plan view;

the second semiconductor layer comprises a (2-1)th semiconductor pattern layer and a (2-2)th semiconductor pattern layer which are spaced apart from each other in a plan view;

each of the (1-1)th semiconductor pattern layer, the (1-2)th semiconductor pattern layer, and the (2-2)th semiconductor pattern layer overlaps the (1-1)th conductive pattern layer in a plan view; and the (2-1)th semiconductor pattern layer overlaps the (1-2)th conductive pattern layer in a plan view.

3. The display device of claim 2, wherein;

the (1-1)th conductive pattern layer is the first electrode of the first capacitor;

the (1-2)th semiconductor pattern layer is the second electrode of the first capacitor and the first electrode of the second capacitor; and the (2-2)th semiconductor pattern layer is the second electrode of the second capacitor.

4. The display device of claim 2, wherein the first insulation layer overlaps an entire surface of the (1-2)th semiconductor pattern layer and the channel region of the (1-1)th semiconductor pattern layer, and does not overlap the source region and the drain region of the (1-1)th semiconductor pattern layer.

5. The display device of claim 4, further comprising:

a second insulation layer disposed on the second semiconductor layer;

a second conductive layer disposed on the second insulation layer; and a third insulation layer disposed on the second conductive layer.

6. The display device of claim 5, wherein the (2-1)th semiconductor pattern layer comprises a source region, a drain region, and a channel region, and the second insulation layer includes:

a (2-1)th insulation pattern layer overlapping the channel region of the (1-1)th semiconductor pattern layer, and a (2-2)th insulation pattern layer overlapping the channel region of the (2-1)th semiconductor pattern layer.

7. The display device of claim 6, wherein the second conductive layer comprises:

a (2-1)th conductive pattern layer overlapping the channel region of the (1-1)th semiconductor pattern layer in a plan view; and a (2-2)th conductive pattern layer overlapping the channel region of the (2-1)th semiconductor pattern layer in a plan view.

8. The display device of claim 5, wherein a thickness of the first insulation layer is less than a thickness of the third insulation layer.

9. The display device of claim 5, further comprising:

a fourth insulation layer disposed on the third insulation layer and a light emitting element disposed on the fourth insulation layer, wherein the light emitting element includes a first electrode, a light emitting layer, and a second electrode which are disposed on the fourth insulation layer, and the first electrode of the light emitting element is electrically connected to the (1-1)th semiconductor pattern layer.

10. The display device of claim 5, further comprising:

a third conductive layer disposed on the third insulation layer, wherein:

the (2-2)th semiconductor pattern layer is a first electrode of a third capacitor; and the third conductive layer is a second electrode of the third capacitor.

11. The display device of claim 1, wherein:

the first conductive layer comprises a (1-1)th conductive pattern layer and a (1-2)th conductive pattern layer which are spaced apart from each other in a plan view;

the first semiconductor layer comprises a (1-1)th semiconductor pattern layer and a (1-2)th semiconductor pattern layer which are spaced apart from each other in a plan view;

the (1-1)th semiconductor pattern layer and (1-2)th semiconductor pattern layer overlap the (1-1)th conductive pattern layer in a plan view; and the second semiconductor layer overlaps the (1-2)th conductive pattern layer in a plan view.

12. The display device of claim 11, wherein the (1-1)th semiconductor pattern layer comprises a source region, a drain region, and a channel region, and the first insulation layer overlaps an entire surface of the (1-2)th semiconductor pattern layer and the channel region of the (1-1)th semiconductor pattern layer, and does not overlap the source region and the drain region of the (1-1)th semiconductor pattern layer.

13. The display device of claim 11, further comprising:

a second insulation layer disposed on the second semiconductor layer; and a second conductive layer disposed on the second insulation layer, wherein:

in a plan view, the second insulation layer includes a (2-1)th insulation pattern layer, a (2-2)th insulation pattern layer, and a (2-3)th insulation pattern layer respectively overlapping the (1-2)th semiconductor pattern layer, the (1-1)th semiconductor pattern layer, and the second semiconductor layer; and in a plan view, the second conductive layer includes a (2-3)th conductive pattern layer, a (2-1)th conductive pattern layer, and a (2-2)th conductive pattern layer respectively overlapping the (2-1)th insulation pattern layer, the (2-2)th insulation pattern layer, and the (2-3)th insulation pattern layer.

14. The display device of claim 13, wherein:

the (1-1)th conductive pattern layer is the first electrode of the first capacitor;

the (1-2)th semiconductor pattern layer is the second electrode of the first capacitor and the first electrode of the second capacitor; and the (2-3)th conductive pattern layer is the second electrode of the second capacitor.

15. The display device of claim 14, further comprising:

a third insulation layer disposed on the second conductive layer, and a third conductive layer disposed on the third insulation layer, wherein:

the (2-3)th conductive pattern layer is a first electrode of a third capacitor; and the third conductive layer is a second electrode of the third capacitor.

16. A display device comprising:

a display panel including a plurality of insulation layers and a pixel electrically connected to a first data line extended in a first direction and a first scan line extended in a second direction intersecting the first direction, wherein the pixel includes:

a first capacitor electrically connected between a first node and a second node;

a light emitting diode including:

a first electrode electrically connected to the second node, a second electrode electrically connected to a first voltage line that receives a first power voltage, and a light emitting layer disposed between the first electrode and the second electrode;

a first transistor electrically connected between the second node and a second voltage line that receives a second power voltage, the first transistor including:

a source, a drain, a channel region, and a gate electrically connected to the first node;

a second transistor electrically connected between the first data line and the first node;

a third transistor electrically connected between the first node and a third voltage line that receives a first voltage;

a fourth transistor electrically connected between the second node and a fourth voltage line that receives a second voltage;

a fifth transistor electrically connected between the second voltage line and the drain or the source of the first transistor; and a second capacitor electrically connected between the second voltage line and the second node, the plurality of insulation layers include:

an inorganic layer, a first insulation layer disposed on the inorganic layer, and a second insulation layer disposed on the first insulation layer; and the display panel further includes a first conductive layer, a first semiconductor layer, and a second semiconductor layer, the first conductive layer is a first electrode of the first capacitor and is disposed on a lower surface of the inorganic layer;

the first semiconductor layer is a second electrode of the first capacitor and a first electrode of the second capacitor and is disposed between the inorganic layer and the first insulation layer;

the second semiconductor layer is a second electrode of the second capacitor and is disposed on an upper surface of the second insulation layer; and each of the first semiconductor layer and the second semiconductor layer includes an oxide semiconductor.

17. The display device of claim 16, wherein the first semiconductor layer comprises:

a (1-1)th semiconductor pattern layer including the source, the drain, and the channel region of the first transistor; and a (1-2)th semiconductor pattern layer including the second electrode of the first capacitor and the first electrode of the second capacitor.

18. The display device of claim 17, wherein the display panel further comprises a third insulation layer disposed on the second insulation layer and a second conductive layer disposed on the third insulation layer, and the second conductive layer is the gate of the first transistor.

19. The display device of claim 18, wherein:

the display panel further comprises a fourth insulation layer disposed on the second conductive layer and a third conductive layer disposed on the fourth insulation layer; and the pixel further includes a third capacitor, the second semiconductor layer is a first electrode of the third capacitor, and the third conductive layer is a second electrode of the third capacitor.

20. A display device comprising:

a display panel including:

a plurality of insulation layers, and a pixel electrically connected to a first data line extended in a first direction and a first scan line extended in a second direction intersecting the first direction, wherein the pixel includes:

a first capacitor electrically connected between a first node and a second node;

a light emitting diode including:

a first electrode electrically connected to the second node, a second electrode electrically connected to a first voltage line that receives a first power voltage, and a light emitting layer disposed between the first electrode and the second electrode;

a first transistor electrically connected between the second node and a second voltage line that receives a second power voltage, the first transistor including:

a source, a drain, a channel region, and a gate electrically connected to the first node;

a second transistor electrically connected between the first data line and the first node;

a third transistor electrically connected between the first node and a third voltage line that receives a first voltage;

a fourth transistor electrically connected between the second node and a fourth voltage line that receives a second voltage;

a fifth transistor electrically connected between the second voltage line and the drain or the source of the first transistor; and a second capacitor electrically connected between the second voltage line and the second node, the plurality of insulation layers include:

an inorganic layer, a first insulation layer disposed on the inorganic layer, and a second insulation layer disposed on the first insulation layer; and the display panel further includes:

a first conductive layer, a first semiconductor layer, a second semiconductor layer, and a second conductive layer, the first conductive layer is a first electrode of the first capacitor and is disposed on a lower surface of the inorganic layer;

the first semiconductor layer is a second electrode of the first capacitor and a first electrode of the second capacitor and is disposed between the inorganic layer and the first insulation layer;

the second semiconductor layer is disposed between the first insulation layer and the second insulation layer and disposed spaced apart from the first semiconductor layer in a plan view;

the second conductive layer is a second electrode of the second capacitor and is disposed on an upper surface of the second insulation layer; and each of the first semiconductor layer and the second semiconductor layer includes an oxide semiconductor.

21. The display device of claim 20, wherein the first semiconductor layer comprises:

a (1-1)th semiconductor pattern layer includes the source, the drain, and the channel region of first transistor; and a (1-2)th semiconductor pattern layer includes the second electrode of the first capacitor and the first electrode of the second capacitor.

22. The display device of claim 21, wherein the second conductive layer comprises:

a (2-3)th conductive pattern layer overlapping the (1-2)th semiconductor pattern layer in a plan view and being the second electrode of the second capacitor; and a (2-1)th conductive pattern layer overlapping the channel region of the first transistor in a plan view, and being the gate of the first transistor.

23. The display device of claim 22, wherein:

the second semiconductor layer is a source, a drain, and a channel region of the second transistor; and the second conductive layer further includes a (2-2)th conductive pattern layer overlapping a channel region of the second semiconductor layer in a plan view, and is a gate of the second transistor.

24. The display device of claim 22, wherein the display panel further comprises a fourth insulation layer disposed on the second conductive layer and a third conductive layer disposed on the fourth insulation layer, the pixel further includes a third capacitor, and the (2-3)th conductive pattern layer is a first electrode of the third capacitor, and the third conductive layer is a second electrode of the third capacitor.

* * * * *